(12) United States Patent
Shen et al.

(10) Patent No.: US 12,080,561 B2
(45) Date of Patent: Sep. 3, 2024

(54) METHOD OF PROCESSING SUBSTRATE

(71) Applicant: NANYA TECHNOLOGY CORPORATION, New Taipei (TW)

(72) Inventors: Zhi-Xuan Shen, Taipei (TW); Yu-Shan Wu, Tainan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 396 days.

(21) Appl. No.: 17/584,567

(22) Filed: Jan. 26, 2022

(65) Prior Publication Data

US 2023/0238248 A1 Jul. 27, 2023

(51) Int. Cl.
*H01L 21/311* (2006.01)
*H01L 21/3213* (2006.01)

(52) U.S. Cl.
CPC .. *H01L 21/31144* (2013.01); *H01L 21/31116* (2013.01); *H01L 21/32135* (2013.01)

(58) Field of Classification Search
CPC ......... H01L 21/32135; H01L 21/31144; H01L 21/31116
See application file for complete search history.

(56) References Cited

U.S. PATENT DOCUMENTS

| | | | |
|---|---|---|---|
| 6,074,488 A * | 6/2000 | Roderick | H01L 21/6831 118/728 |
| 7,052,967 B2 | 5/2006 | Lee et al. | |
| 7,859,053 B2 | 12/2010 | Chang et al. | |
| 9,543,139 B2 | 1/2017 | Matsudaira et al. | |
| 9,837,312 B1 * | 12/2017 | Tan | C23C 18/1628 |
| 11,195,951 B2 * | 12/2021 | Yu | H01L 29/41791 |
| 2006/0128131 A1 * | 6/2006 | Chang | H10B 12/056 438/626 |
| 2007/0155027 A1 * | 7/2007 | Ditizio | H10N 50/01 257/E43.006 |

(Continued)

FOREIGN PATENT DOCUMENTS

TW I416592 B 11/2013

OTHER PUBLICATIONS

Office Action mailed on Nov. 3, 2022 related to Taiwanese Application No. 111115851.

(Continued)

*Primary Examiner* — Edward Chin
(74) *Attorney, Agent, or Firm* — Xuan Zhang

(57) ABSTRACT

The present application provides a method for process a substrate. The method includes steps of providing a substrate having a sacrificial layer and an insulative layer, forming a polysilicon hardmask on the insulative layer, etching the insulative and sacrificial layers through multiple openings in the polysilicon hardmask to thus form multiple channels, depositing a metal film and a passivation film on the polysilicon hardmask and in the channels, performing a first removal process to remove portions of the passivation film and the metal film above the polysilicon hardmask, performing a second removal process to remove portions of the polysilicon hardmask exposed through the passivation film and the metal film, and performing a third removal process to remove the polysilicon hardmask and portions of the passivation film and the metal film surrounding the polysilicon is hardmask.

17 Claims, 24 Drawing Sheets

(56) References Cited

U.S. PATENT DOCUMENTS

| | | | |
|---|---|---|---|
| 2010/0003828 A1* | 1/2010 | Ding | H01L 21/32136 |
| | | | 438/720 |
| 2012/0244693 A1* | 9/2012 | Luong | H01L 21/28247 |
| | | | 438/591 |
| 2015/0287831 A1* | 10/2015 | Tanaka | H01L 29/78606 |
| | | | 257/43 |
| 2015/0316804 A1* | 11/2015 | Miyamoto | H01L 27/1288 |
| | | | 438/23 |
| 2021/0408225 A1* | 12/2021 | Seo | G06V 10/778 |

OTHER PUBLICATIONS

Office Action mailed on Feb. 20, 2022 related to Taiwanese Application No. 111115870.

Notice of Allowance dated Mar. 16, 2023 related to Taiwanese Application No. 111115851.

Notice of Allowance dated Apr. 24, 2023 related to Taiwanese Application No. 111115870.

\* cited by examiner

METHOD OF PROCESSING SUBSTRATE

TECHNICAL FIELD

The present disclosure relates to a method of processing a substrate, and more particularly, to a method of patterning a substrate comprised of oxide and nitride layers.

DISCUSSION OF THE BACKGROUND

The semiconductor industry has developed an ultra-fine technique for providing patterns of several nanometers in scale. Such ultra-fine technique benefits from effective lithographic techniques. A typical lithographic technique includes providing a material layer on a semiconductor substrate, coating a photoresist layer on the material layer, exposing and developing the photoresist layer to provide a is photoresist pattern, and etching the material layer using the photoresist pattern as a mask.

When minimizing the pattern to be formed, it may be difficult to provide a fine pattern having a desirable profile using only the typical lithographic technique described above. Accordingly, a layer, referred to herein as a hardmask, may be formed between the material layer to be etched and the photoresist layer to provide a fine pattern. The hardmask serves as an interlayer that transfers the fine pattern of the photoresist to the material layer through a selective etching process. Thus, the hardmask layer needs to have chemical resistance, thermal resistance, and etching resistance in order to endure various types of etching processes.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a substrate processing method. The method includes steps of providing a substrate comprising a sacrificial layer and an insulative layer stacked on the sacrificial layer; forming a polysilicon hardmask on the insulative layer; is etching the insulative layer and the sacrificial layer exposed through a plurality of openings of the polysilicon hardmask to form a plurality of channels; depositing a metal film on the polysilicon hardmask and in the channels; depositing a passivation film on the metal film; performing a first removal process to remove portions of the passivation film and the metal film above the polysilicon hardmask; performing a second removal process to remove portions of the polysilicon hardmask exposed through the passivation film and the metal film; and performing a third removal process to remove the polysilicon hardmask and portions of the passivation film and the metal film surrounding the polysilicon hardmask.

In some embodiments, the passivation film includes oxide and protects the insulative layer and the sacrificial layer from removal during the first, second and third removal processes.

In some embodiments, the first removal process uses a process gas that comprises a mixture of boron trichloride ($BCl_3$), chlorine (Cl) and carbon tetrafluoride ($CF_4$).

In some embodiments, a ratio of the boron trichloride ($BCl_3$) to the chlorine (Cl) to the carbon tetrafluoride ($CF_4$) is 2:1:1.

In some embodiments, the first removal process is performed under a pressure of 50 mTorrs.

In some embodiments, the second removal process uses boron trichloride ($BCl_3$) and chlorine (Cl) as reaction gases.

In some embodiments, a ratio of the boron trichloride ($BCl_3$) to the chlorine (Cl) is 1:1.

In some embodiments, the second removal process is performed under a pressure of 10 mTorrs.

In some embodiments, the second removal process uses hydrogen bromide (HBr) as a reaction gas.

In some embodiments, the second removal process is performed under a pressure of 50 to 80 mTorrs.

In some embodiments, the second removal process is performed under a power of 1500 watts, a bias voltage of 200 volts, and a duty cycle of 50%.

In some embodiments, the third removal process uses chlorine (Cl), oxygen ($O_2$) and carbon tetrafluoride ($CF_4$) as reaction gases.

In some embodiments, a ratio of the chlorine (Cl) to the oxygen ($O_2$) to the carbon tetrafluoride ($CF_4$) is 20:1:1.

In some embodiments, the third removal process is performed under a pressure of less than 20 mTorrs.

In some embodiments, the metal liner comprises refractory metal and nitride.

One aspect of the present disclosure provides a substrate processing method. The method includes steps of depositing a sacrificial layer on a bottom electrode; depositing an insulative layer on the sacrificial layer; forming a polysilicon hardmask on the insulative layer; etching the insulative layer and the sacrificial layer exposed through a plurality of openings in the polysilicon hardmask to thus form a plurality of channels; depositing a metal film on the polysilicon hardmask and in the channels; depositing a passivation film on the metal film; performing a first removal process to remove portions of the passivation film and the metal film over the polysilicon is hardmask; performing a second removal process to remove portions of the polysilicon hardmask exposed through the passivation film and the metal film; performing a third removal process to remove the polysilicon hardmask and portions of the passivation film and the metal film surrounding the polysilicon hardmask; removing the passivation film and the film; depositing a conductive material in the channels and in contact with the insulative layer and the sacrificial layer; removing the sacrificial layer; and forming a top electrode on the insulative layer.

In some embodiments, horizontal portions of the passivation film and the metal film on the bottom electrode and a topmost surface of the polysilicon hardmask are removed during the first removal process In some embodiments, the passivation film includes oxide and protects the insulative layer and the sacrificial layer from removal during the first to third removal processes.

In some embodiments, the first removal process uses a process gas that comprises a mixture of boron trichloride ($BCl_3$), chlorine (Cl) and carbon tetrafluoride ($CF_4$).

In some embodiments, a ratio of the boron trichloride ($BCl_3$) to the chlorine (Cl) to the carbon tetrafluoride ($CF_4$) is 2:1:1.

In some embodiments, the first removal process is performed under a pressure of 50 mTorrs.

In some embodiments, the second removal process uses boron trichloride ($BCl_3$) and chlorine (Cl) as reaction gases.

In some embodiments, a ratio of the boron trichloride (BCl₃) to the chlorine (Cl) is 1:1.

In some embodiments, the second removal process is performed under a pressure of 10 mTorrs.

In some embodiments, the second removal process uses hydrogen bromide (HBr) as a reaction gas.

In some embodiments, the second removal process is performed under a pressure of 50 to 80 mTorrs.

In some embodiments, the second removal process is performed under a power of 1500 watts, a bias voltage of 200 volts, and a duty cycle of 50%.

In some embodiments, the third removal process uses chlorine (Cl), oxygen (O₂) and carbon tetrafluoride (CF₄) as reaction gases.

In some embodiments, a ratio of the chlorine (Cl) to the oxygen (O₂) to the carbon tetrafluoride (CF₄) is 20:1:1.

In some embodiments, the third removal process is performed under a pressure of less than 20 mTorrs.

In some embodiments, the metal liner comprises refractory metal and nitride.

In some embodiments, the removal of the passivation film is prior to the removal of the metal film.

With the above-mentioned configurations that pattern a substrate including multiple layers using the hardmask, the hardmask on the patterned substrate can be removed by performing the removal processes in situ, so that a possibility of contamination can be reduced and processing time may be saved.

The foregoing has outlined rather broadly the features and technical advantages of the present disclosure in order that the detailed is description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1A:
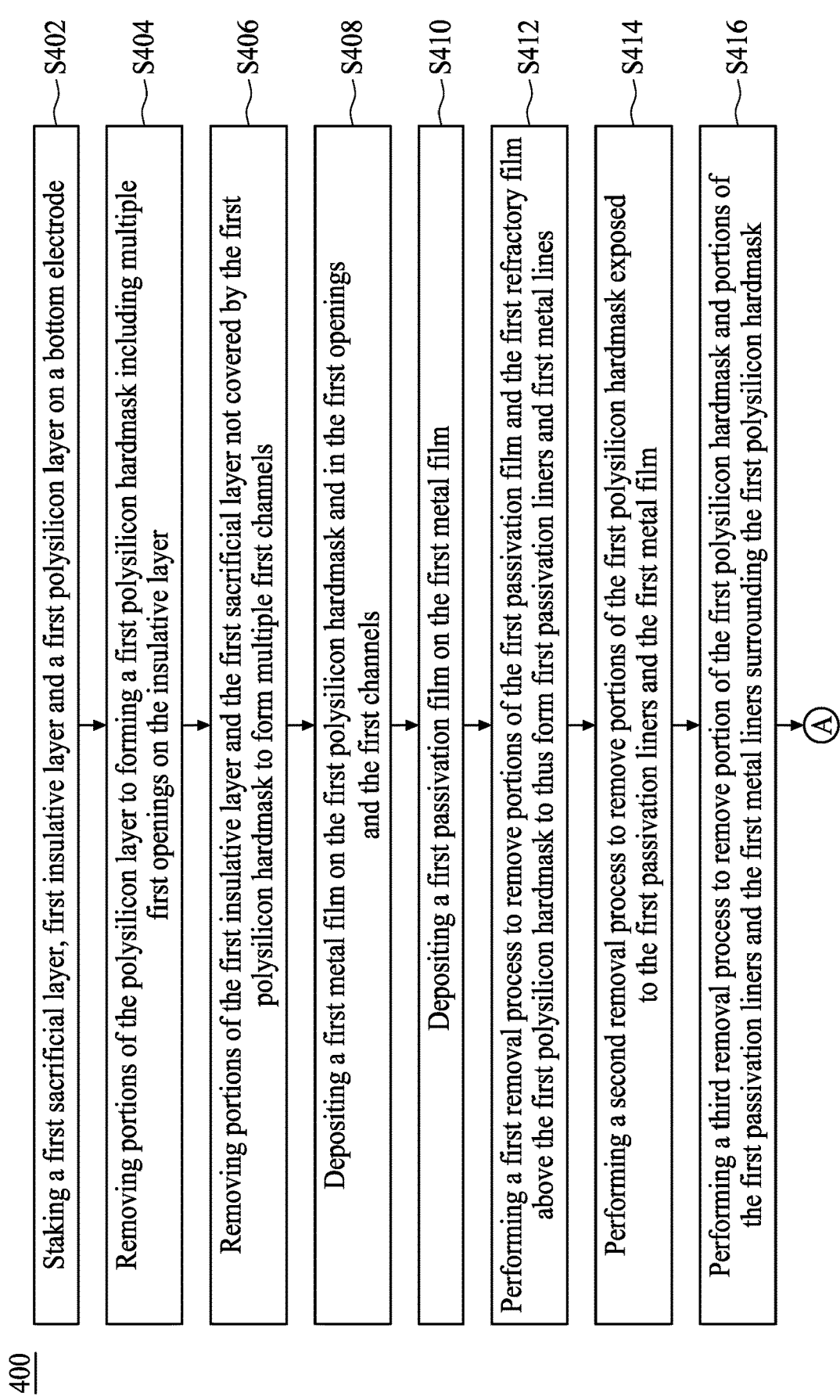
FIGS. 1A to 1C illustrate a flow diagram illustrating a method of manufacturing a capacitor array in accordance with some embodiments of the present disclosure.

Embodiments, or examples, of the disclosure illustrated in the is drawings are described below using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 1B:
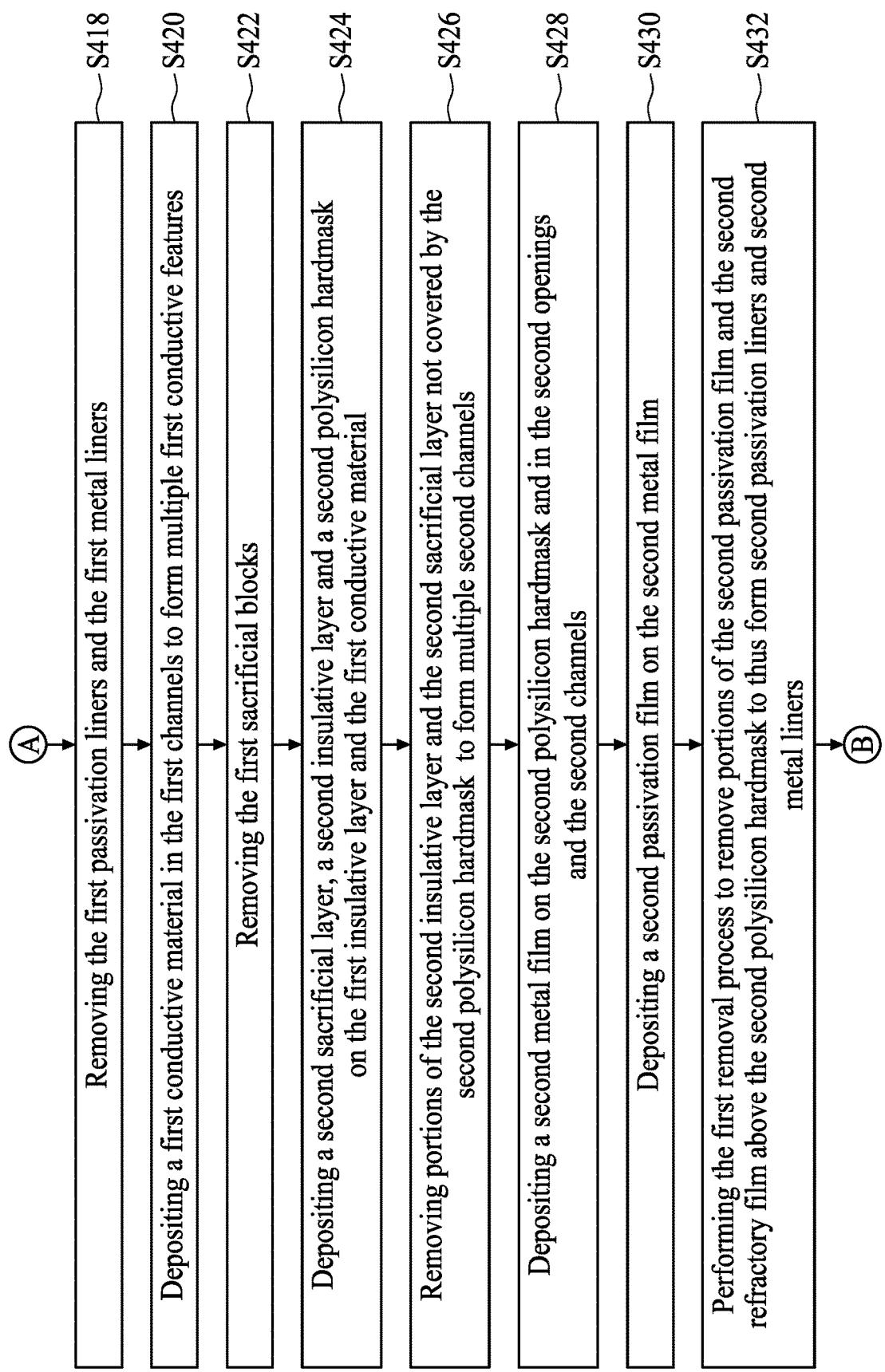
Figure 1C:
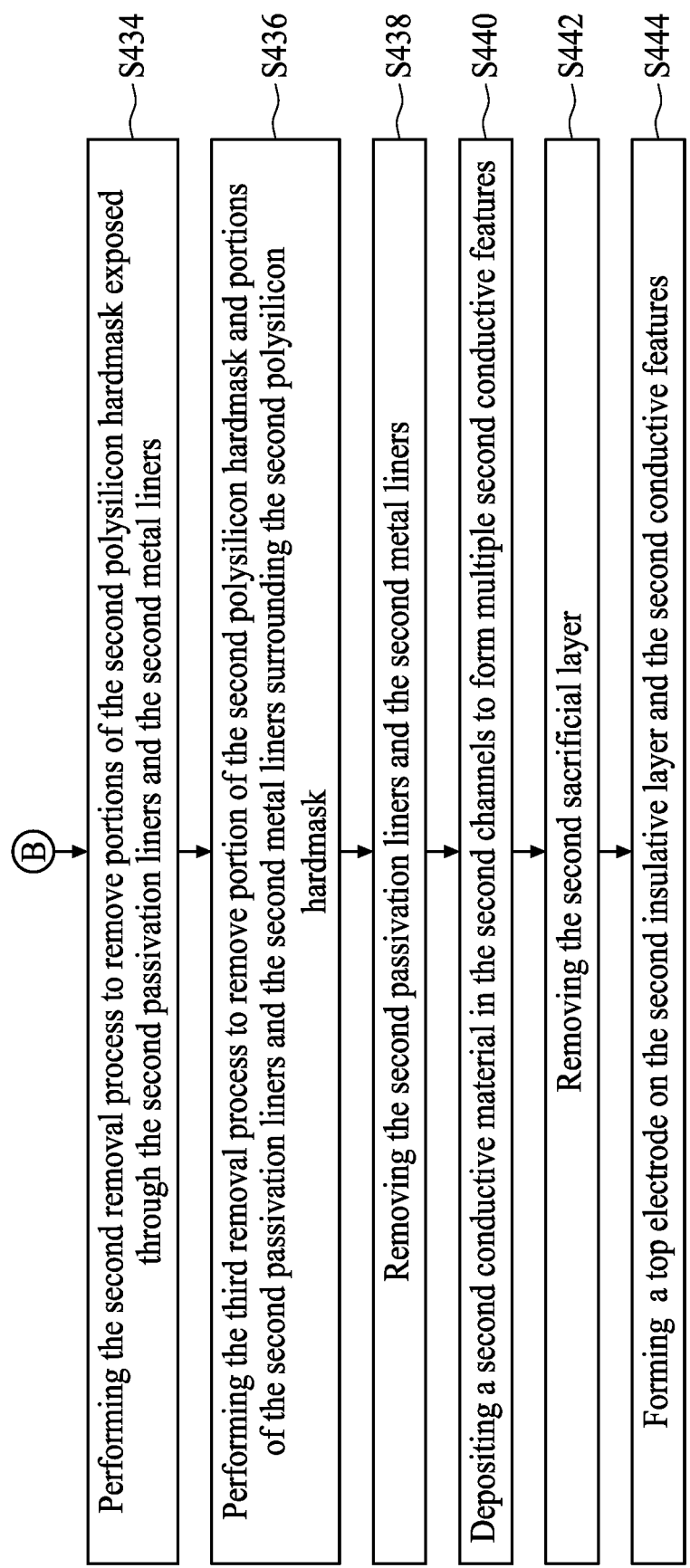

FIGS. 1A to 1C illustrate a flow diagram illustrating a method 400 of manufacturing a capacitor array 10 in accordance with some embodiment of the present disclosure. FIGS. 2 to 22 are schematic diagrams illustrating various fabrication stages constructed according to the method 400 for manufacturing the capacitor array 10 in accordance with some embodiments of the present disclosure. The stages shown in FIGS. 2 to 22 are also illustrated schematically in the flow diagram in FIGS. 1A to 1C. In the subsequent discussion, the fabrication stages shown in FIGS. 2 to 22 are discussed in reference to the process steps shown in FIGS. 1A to 1C.

Figure 2:
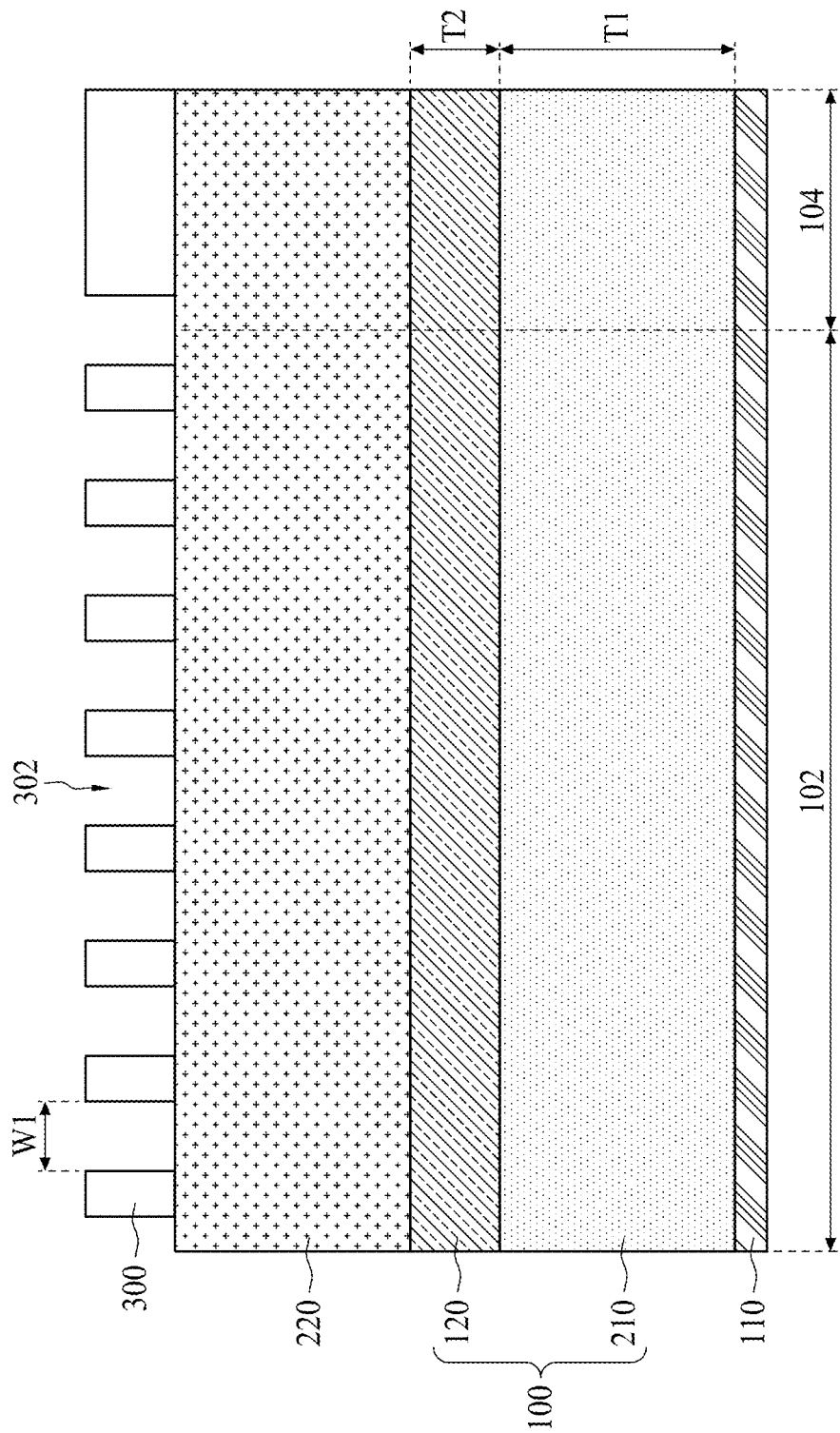
FIGS. 2 through 22 illustrate cross-sectional views of intermediate stages in the formation of a capacitor array in accordance with some embodiments of the present disclosure.

Referring to FIG. 2, a bottom electrode 110 is provided, and a first sacrificial layer 210, a first insulative layer 120 and a first polysilicon layer 220 are stacked on the bottom electrode 110 according to a step S402 in FIG. 1A. As shown in FIG. 2, the first sacrificial layer 210 covers the bottom electrode 110, and the first insulative layer 120 is sandwiched between the first sacrificial layer 210 and the first polysilicon layer 220. The bottom electrode 110 is formed from conductive materials having high conductivity to ensure fast device speeds. The first sacrificial layer 210, including oxide, has a first thickness T1, and the first insulative layer 120 has a second thickness T2 less than the first thickness T1. The first sacrificial layer 210 and the first insulative layer 120 are referred as a substrate 100.

The first sacrificial layer 210 is blanketly deposited on the bottom electrode 110 using a chemical vapor deposition (CVD) process, a physical vapor deposition (PVD) process or a spin-on process. The first insulative layer 120, including nitride, e.g., silicon nitride, is deposited to conformally cover the first sacrificial layer 210, using a CVD process or a PVD process, for example. The first polysilicon layer 220 may be formed using a low pressure chemical vapor deposition (LPCVD) process. In some embodiments, a planarizing process can be performed on the first insulative layer 120 prior to the deposition of the first polysilicon layer 220 to yield an acceptably flat topology.

Subsequently, a feature pattern 300 is applied on the first polysilicon layer 220. The feature pattern 300 is composed of various materials according to the material of an etch layer (i.e., the polysilicon layer) to be subjected to etching and the usage of the patterns to be formed. The feature pattern 300 may have been formed in a previous etching process, which forms multiple windows 302 having a first width W1 in the feature pattern 300 by removing material from areas exposed to one or more etchants. The windows 302 are located in an array region 102 surrounded by a periphery region 104, and expose portions of the first polysilicon layer 220 to be subsequently etched.

Figure 3:
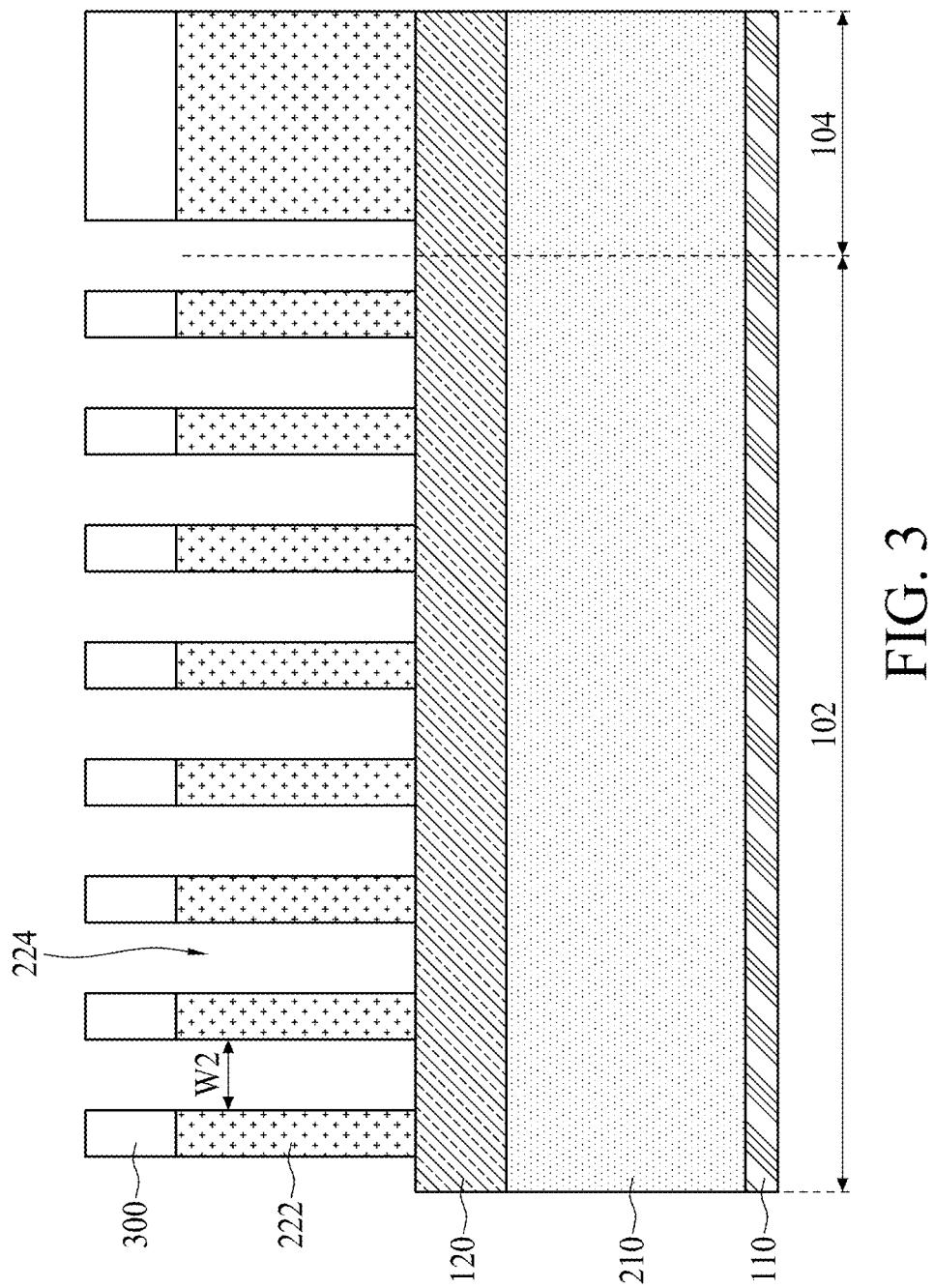

Referring to FIG. 3, portions of the first polysilicon layer 220 not covered by the feature pattern 300 are removed to form multiple first openings 224 according to a step S404 in FIG. 1A. Consequently, a first polysilicon hardmask 222 is created. The feature pattern 300 is transferred to the first polysilicon layer 220 using a well-known etching process, such as an anisotropic plasma etching process. The first polysilicon hardmask 222 is formed using the feature pattern 300 as a mask.

As shown in FIG. 3, the first openings 224 have a second width W2, which is identical to the first width W1 of the windows 302 in the feature pattern 300. Generally, the purpose of the first polysilicon hardmask 222 is to provide a faithful reproduction of the feature pattern 230 into the first insulative layer 120 and the first sacrificial layer 210. That is, portions of the first insulative layer 120 and the first sacrificial layer 210 to be subsequently etched are exposed through the openings 224. After the formation of the first polysilicon hardmask 222, the feature pattern 300 is completely removed using, for example, an etching process, a chemical mechanical polishing (CMP) process, or the like.

Figure 4:
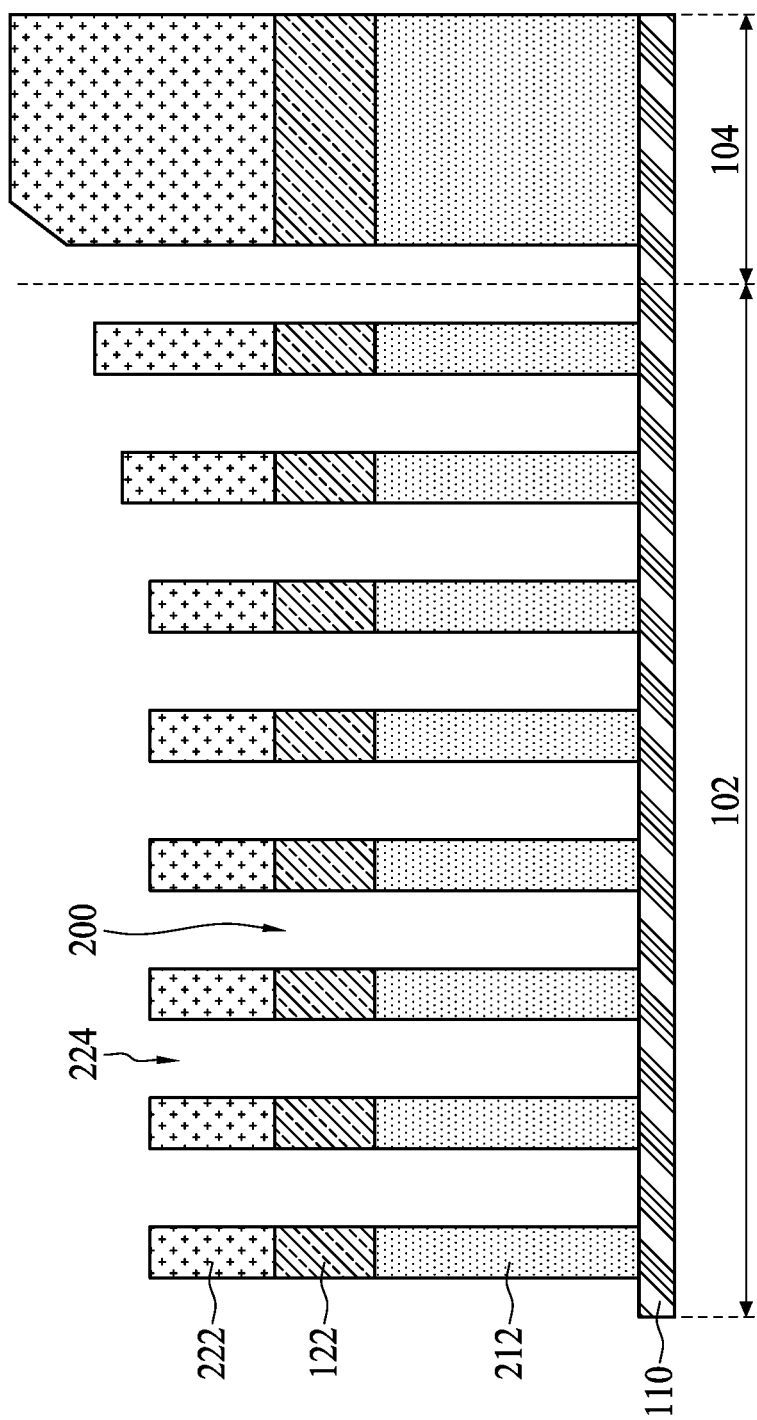

Referring to FIG. 4, portions of the first insulative layer 120 and the first sacrificial layer 210 not covered by the first polysilicon hardmask 222 are removed to form multiple first channels 200 according to a step S406 in FIG. 1A. The first channels 200 can be formed in a variety of ways. In some embodiments, the first channels 200 can be created in an etching process utilizing multiple etchants, selected based on materials of the first insulative layer 120 and the first sacrificial layer 210, to sequentially etch the first insulative layer 120 and the first sacrificial layer 210 until portions of the bottom electrode 110 are exposed. The etching process may consume a portion of the first polysilicon hardmask 222. Because an etching rate is related to a feature size and greater value of feature size corresponding to greater values of the etching rate, a remaining first polysilicon hardmask 222 in the array region 102 and the periphery region 104 has a non-uniform thickness.

Figure 5:
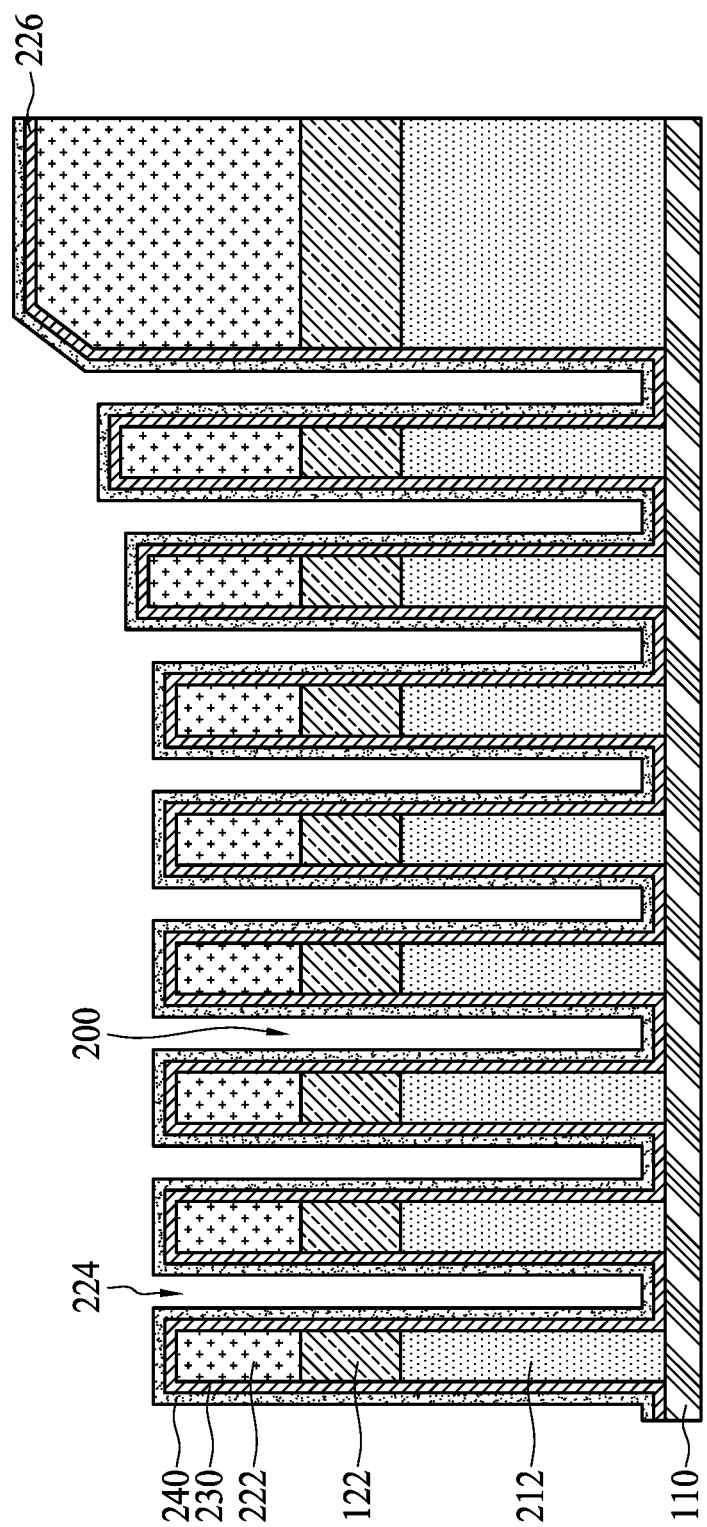

Referring to FIG. 5, a first metal film 230 and a first passivation film 240 are sequentially disposed on the first polysilicon hardmask 222 and in the first openings 224 and the first channels 200 according to steps S408 and S410 in FIG. 1A. The first metal film 230, such as titanium nitride (TiN), is conformally deposited on the first polysilicon hardmask 222 over the bottom electrode 110, portions of the polysilicon hardmask 222 exposed to the first openings 224, and portions of the remaining first insulative layer (hereinafter referred to as the "first insulative layer 122") and the remaining first sacrificial layer (hereinafter referred to as the "first sacrificial blocks 212") exposed to the first channels 200. Accordingly, the first metal film 230 has a topology following a topology of the first polysilicon hardmask 222, the first insulative layer 122, the first sacrificial block 212 and the bottom electrode 110. The first passivation film 240 is blankety deposited on the first metal film 230. The first metal film 230 and the first passivation film 240 have substantially uniform thicknesses. The first metal film 230 can be formed using a PVD process or an atomic layer deposition (ALD) process, and the first passivation film 240, including oxide, is formed using an ALD process.

Figure 6:
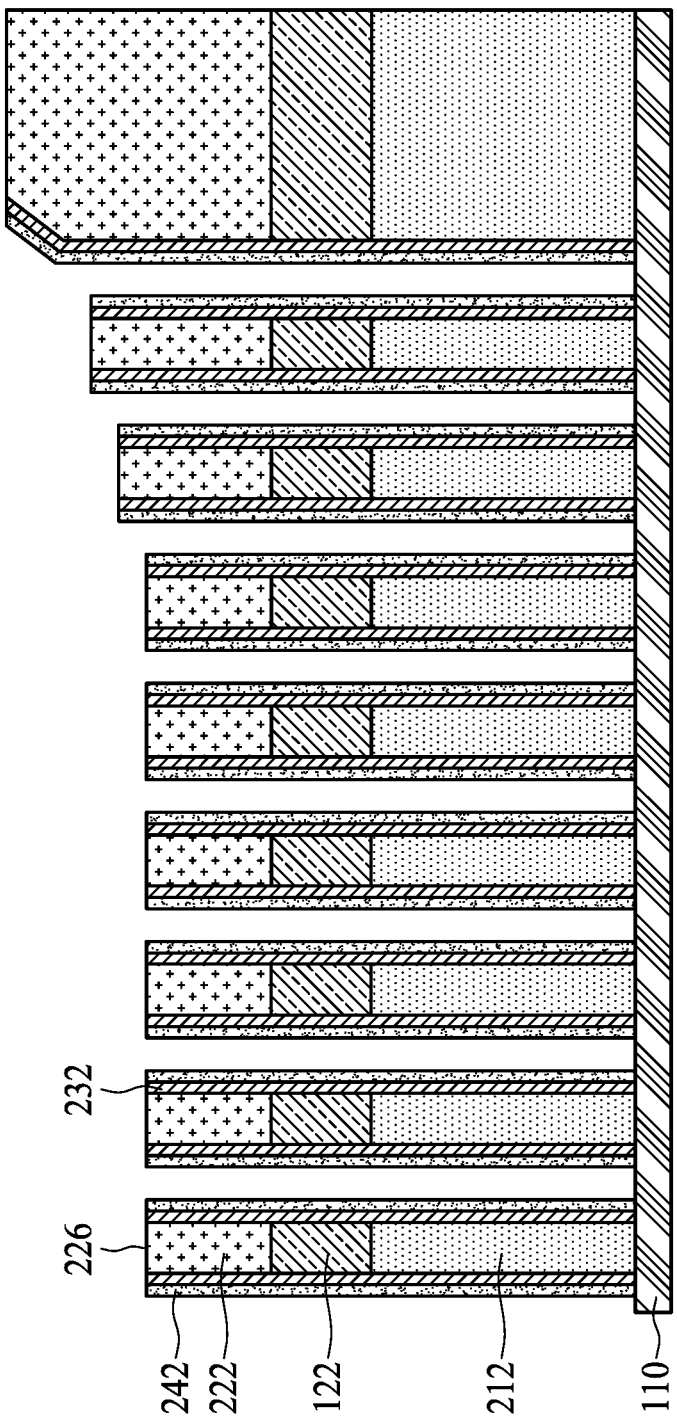

Referring to FIG. 6, a first removal process is performed to remove portions of the first metal film 230 and the first passivation film 240 above the first polysilicon hardmask 222 according to a step S412 in FIG. 1A. Consequently, topmost surfaces 226 of the first polysilicon hardmask 222 are exposed. In some embodiments, an anisotropic etching process is performed to remove horizontal portions of the first passivation film 240 and the first metal film 230 on the bottom electrode 110 and the topmost surfaces 226 of the first polysilicon hardmask 222, while vertical portions of the first metal film 230 and the first passivation film 240 are left on portions of the first sacrificial blocks 212 and the first insulative layer 122 exposed to the first channels 200 and the first polysilicon hardmask 222 exposed to the openings 224, to thereby form a plurality of first metal liners 232 and a plurality of first passivation liners 242 on sidewalls of the first sacrificial blocks 212, the first insulative layer 122 and the first polysilicon hardmask 222.

The first removal process can be performed under a pressure of 50 mTorrs using a process gas that comprises a mixture of boron trichloride ($BCl_3$), chlorine (Cl) and carbon tetrafluoride ($CF_4$) applied to horizontal portions of the first passivation film 240 and the first metal film 230. In some embodiments, a ratio of the boron trichloride to the chlorine to the carbon tetrafluoride is, for example, 2:1:1.

Figure 7:
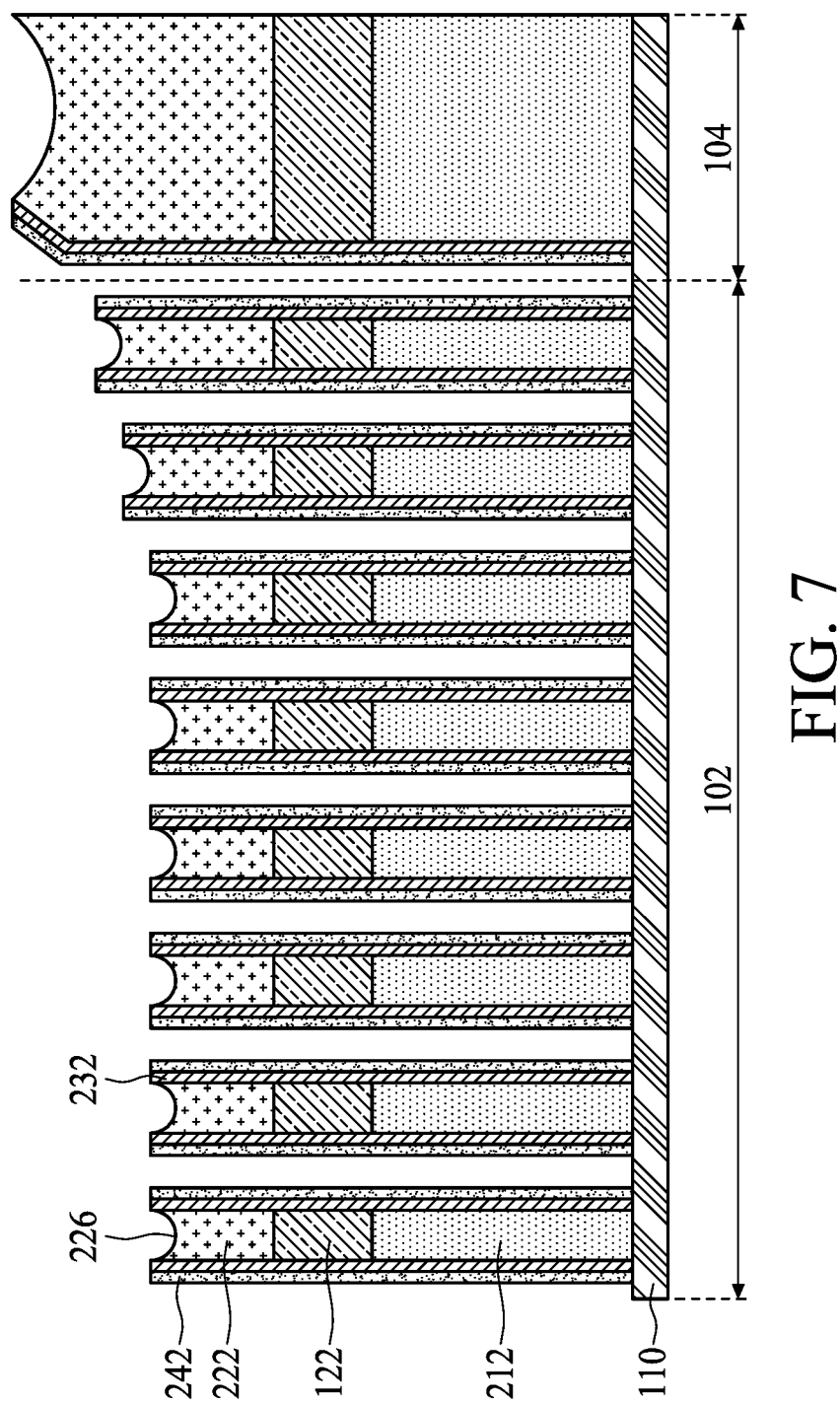

Referring to FIG. 7, subsequently, a second removal process is performed to remove portions of the first polysilicon hardmask 222 exposed to the first metal liners 232 and the first passivation liners 242 according to a step S414 in FIG. 1A. In some embodiments, the second removal process can be performed under a pressure of 50 mTorrs using boron trichloride and chlorine as reaction gases. In addition, a ratio of the boron trichloride to the chlorine is, for example, 1:1. Alternatively, the second removal process may be performed under a pressure of 50 to 80 mTorrs, a power of 1500 watts, a bias voltage of 200 volts, and a duty cycle of 50%, using hydrogen bromide (HBr) as a reaction gas. During the second removal process, the polysilicon hardmask 222 is recessed so that the top surface 226 of the polysilicon hardmask 222 is no longer a flat surface. Because the exposed area of the polysilicon hardmask 222 in the periphery region 104 is greater than that in the array region 102, the recess depth of the polysilicon hardmask 222 in the periphery region 104 is greater than that in the array region. Consequently, the non-uniform thickness of the first polysilicon hardmask 222 can be reduced.

Figure 8:
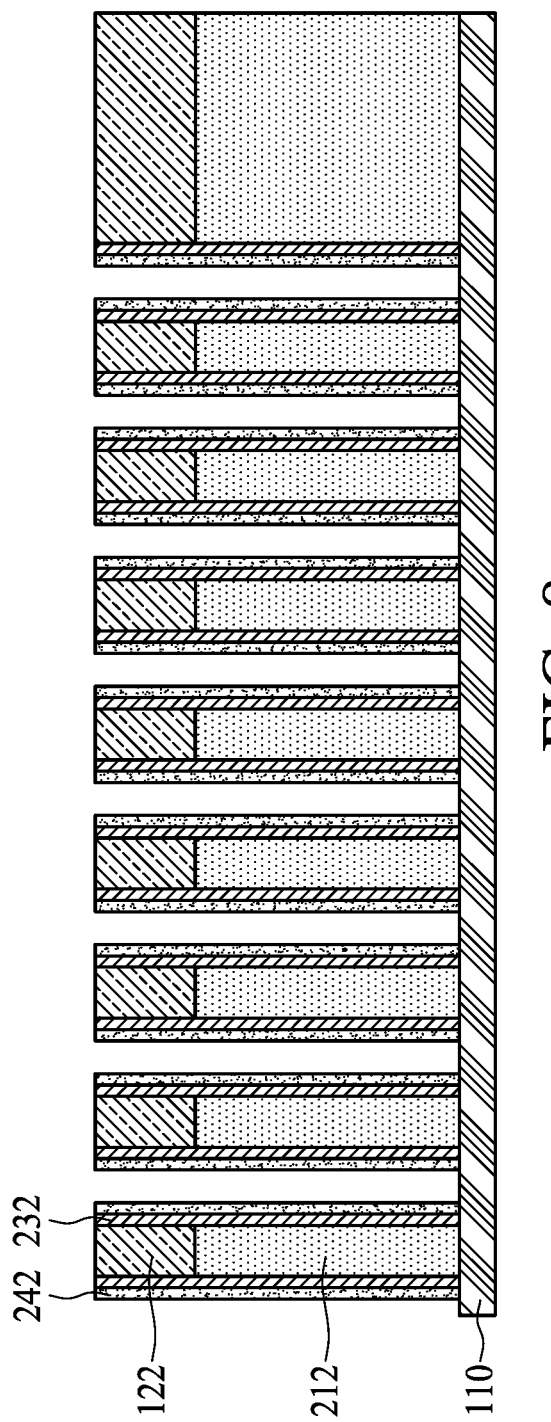

Referring to FIG. 8, a third removal process is performed to remove the first polysilicon hardmask 222 and portions of the first is metal liner 232 and the first passivation liner 242 surrounding the first polysilicon hardmask 222 according to a step S416 in FIG. 1A. The third removal process is performed under a pressure of less than 20 mTorrs, e.g., 10 mTorrs, using oxygen ($O_2$), chlorine and carbon tetrafluoride as reaction gases. In some embodiments, a ratio of the oxygen to the chlorine to the carbon tetrafluoride is, for example, 1:20:1. The first polysilicon hardmask 222 is completely removed from the first insulating layer 122 during the third removal process. Notably, the first removal process, the second removal process and the third process can be performed in situ to save processing time and reduce possibility of contamination. As used herein, the term "in situ" is used to refer to a process in which the layers or films being processed are not exposed to an external ambient (e.g., external to the processing system) environment.

Figure 9:
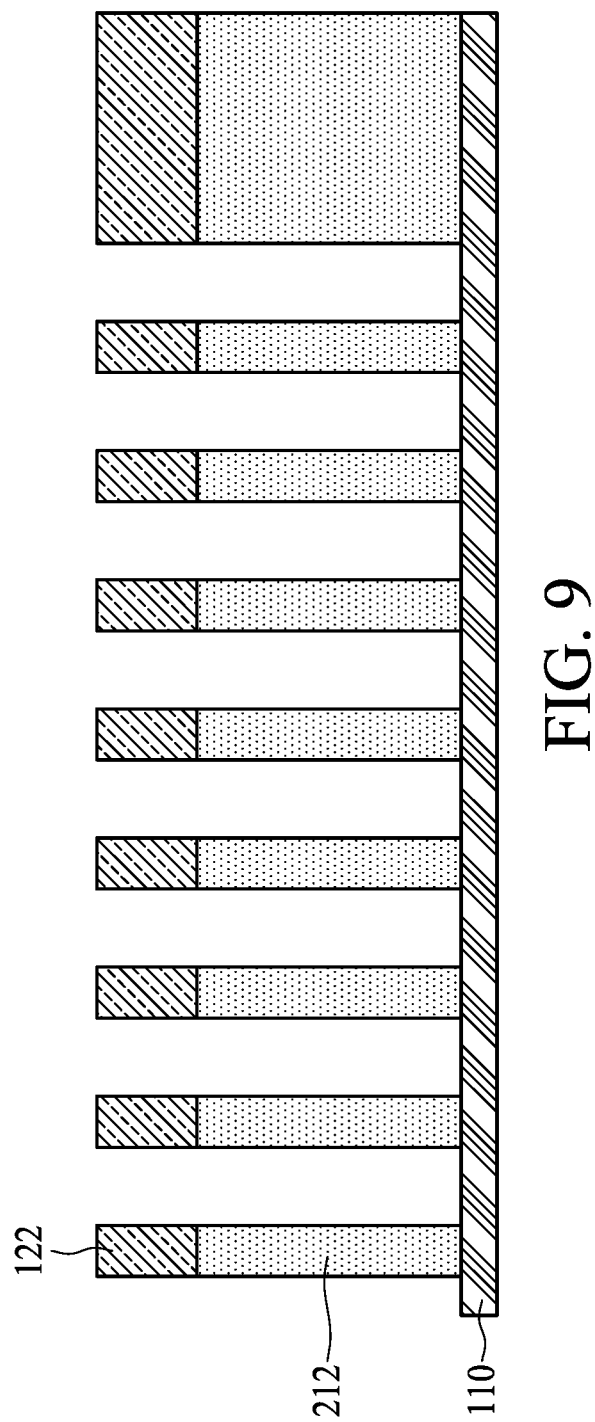

Referring to FIG. 9, after the third removal process, the first passivation liners 242 and the first metal liners 232, used for protecting the first insulative layer 122 and the first sacrificial blocks 212 from being etched, are subsequently removed according to a step S418 in FIG. 1B. The first passivation liners 242 and the first metal liners 232 are removed using wet etching processes, for example. Due to the first sacrificial blocks 212 and the first passivation layer 242 have the same material (e.g., oxide), the first passivation liners 242 may be removed prior to the removal of the first metal liners 232.

Figure 10:
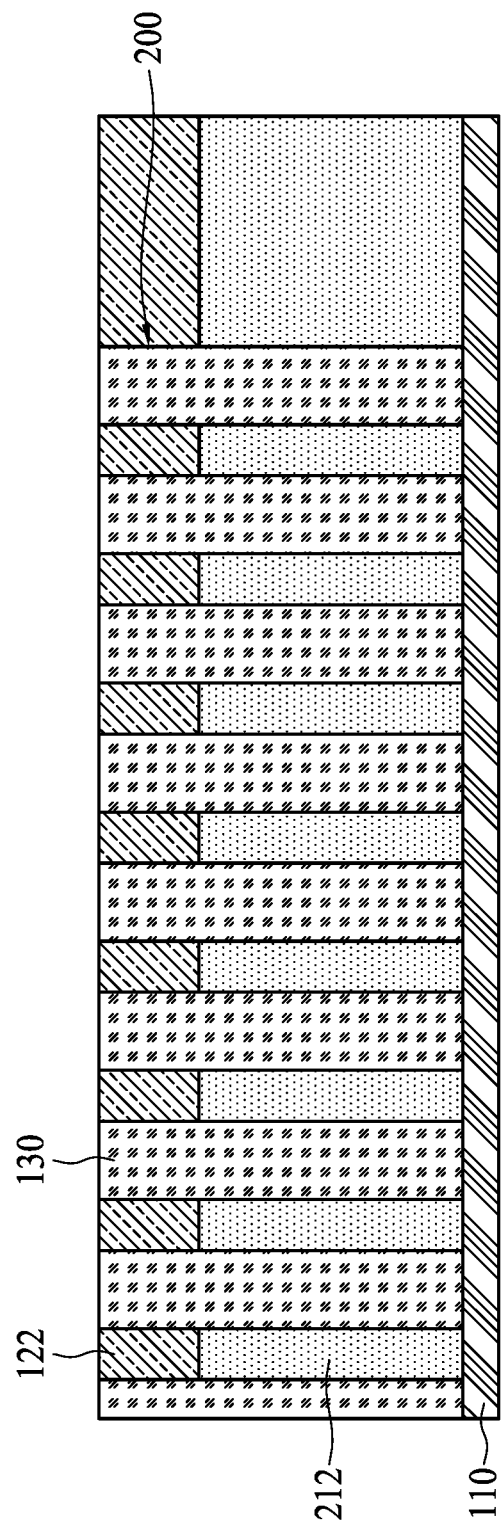

Referring to FIG. 10, a first conductive material is deposited in the first channels 200 according to a step S420 in FIG. 1B. The first conductive material, including tungsten, is uniformly deposited to fill the first channels 200 and cover the first insulative layer 122 until the first channels 200 are entirely filled. Next, a planarization process, which may include a CMP process, is performed on the first conductive material until the first insulative layer 122 are exposed. Accordingly, multiple first conductive features 130, parallel to each other, are formed. Each of the first conductive features 130 may have a line structure when viewed in a cross-sectional view.

Figure 11:
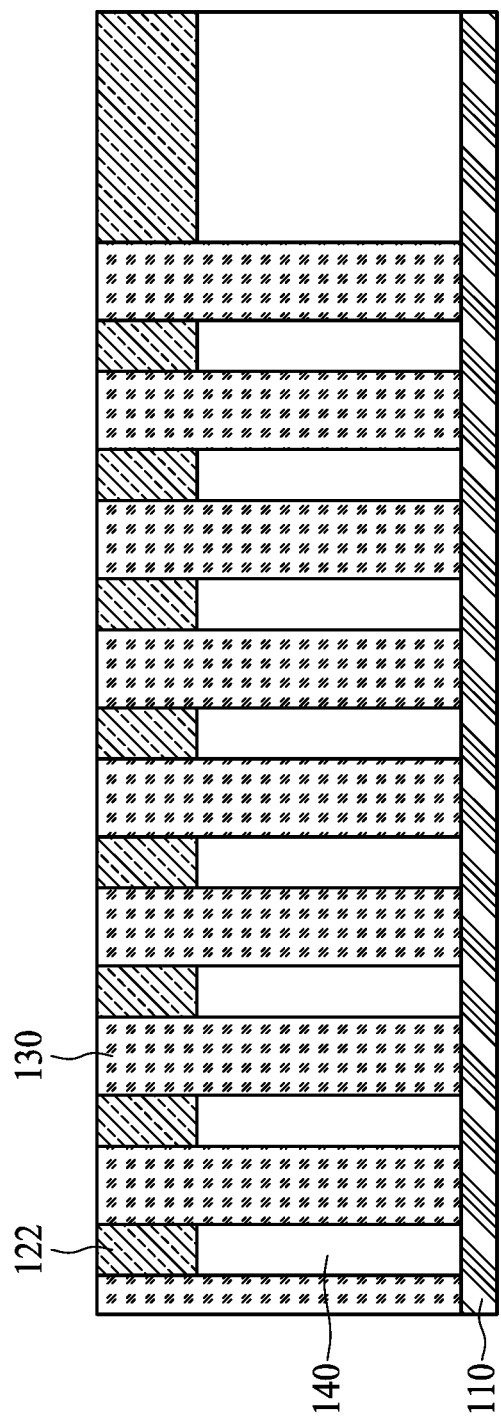

After the planarization process, top surfaces of the first conductive features 130 and top surfaces of the first insulative layer 122 are level with each other. The first conductive features 130 can have an aspect ratio in a range between 42:1 and 45:1. Referring to FIGS. 2 and 11, the aspect ratio of the first conductive features 130 can be adjusted by controlling the width W1 of the feature pattern 300, the first thickness T1 of the first sacrificial layer 210 and the second thickness T2 of the first insulative layer 120.

Referring to FIG. 11, the first sacrificial blocks 212 are removed according to a step S422 in FIG. 1B. Consequently, spaces previously occupied by the first sacrificial blocks 212 remain as air gaps 140. Each of the air gaps 140, holding an ambient gas (such as air), may have a line structure that extends in parallel to the first conductive feature 130 viewed in a cross-sectional view. The first sacrificial blocks 212 may be removed using a strip process and/or wet etching process.

Figure 12:
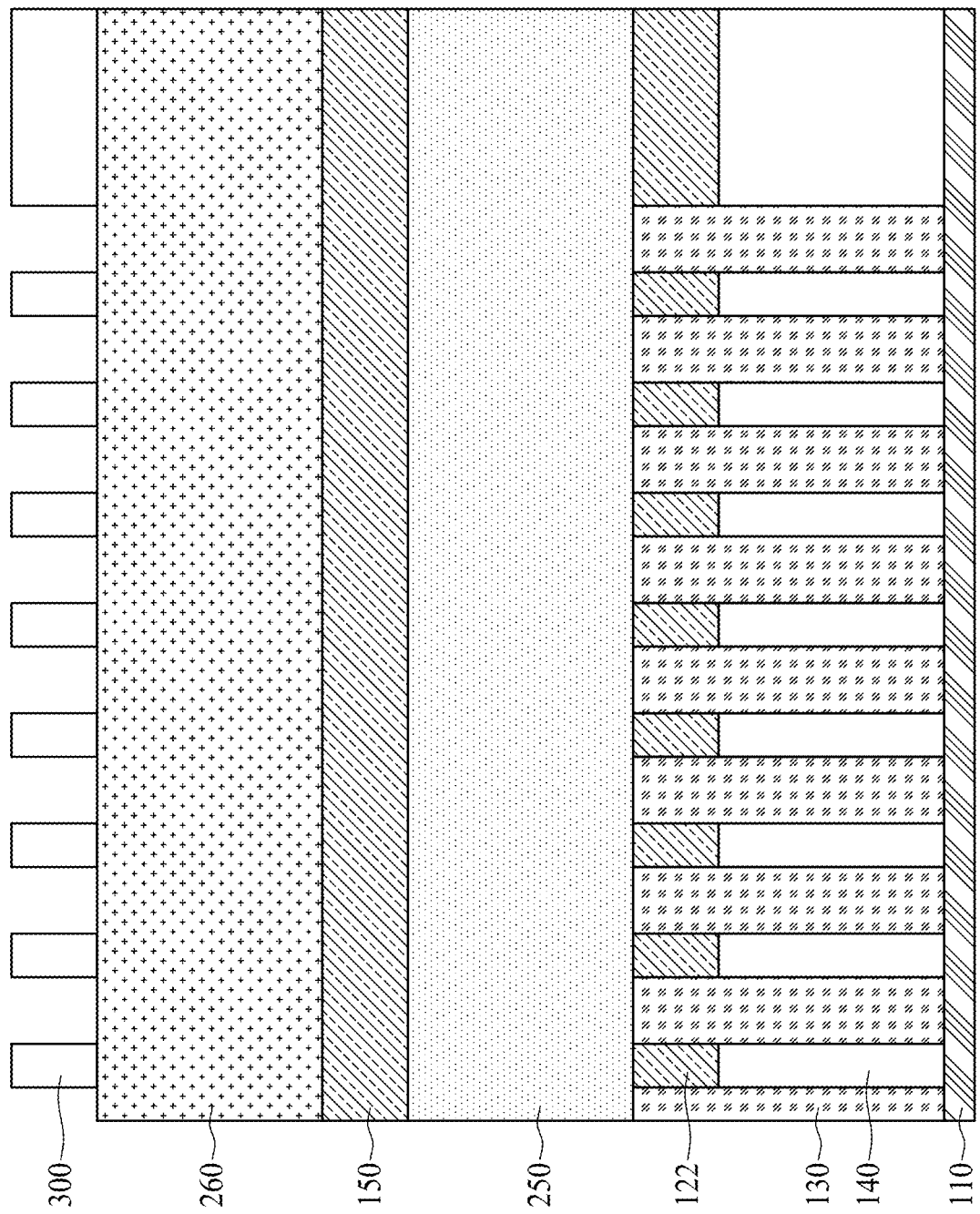

Referring to FIG. 12, a second sacrificial layer 250, a second insulative layer 150 and a second polysilicon layer 260 are sequentially formed on the first insulative layer 122 and the first conductive features 130 according to a step S424 in FIG. 1B. The second sacrificial layer 250 is conformally deposited to cover the first insulative layer 122 and the first conductor material 130. The second sacrificial layer 250, including oxide, can be blanketly disposed on the first insulative layer 122 and the first conductive material 130 using a process such as a CVD process, although any acceptable process may be utilized to form the second sacrificial layer 250 to a predefined thickness. The second sacrificial layer 250 may include oxide, and the second sacrificial layer 250 may include the same material as the first sacrificial layer 210.

The second insulative layer 150 is deposited on the second sacrificial layer 250 to conformally cover the second sacrificial layer 250. The second insulative layer 150, including dielectric material, is formed on the second sacrificial layer 250 using a CVD process. The second insulative layer 150 may include nitride. Additionally, the first insulative layer 120 and second insulative layer 150 may have the same material.

The second polysilicon layer 260 is deposited to cover the second insulative layer 150. In some embodiments, the second polysilicon layer 260 may be formed by same process(es) as the first polysilicon layer 220 (shown in FIG. 2).

Figure 13:
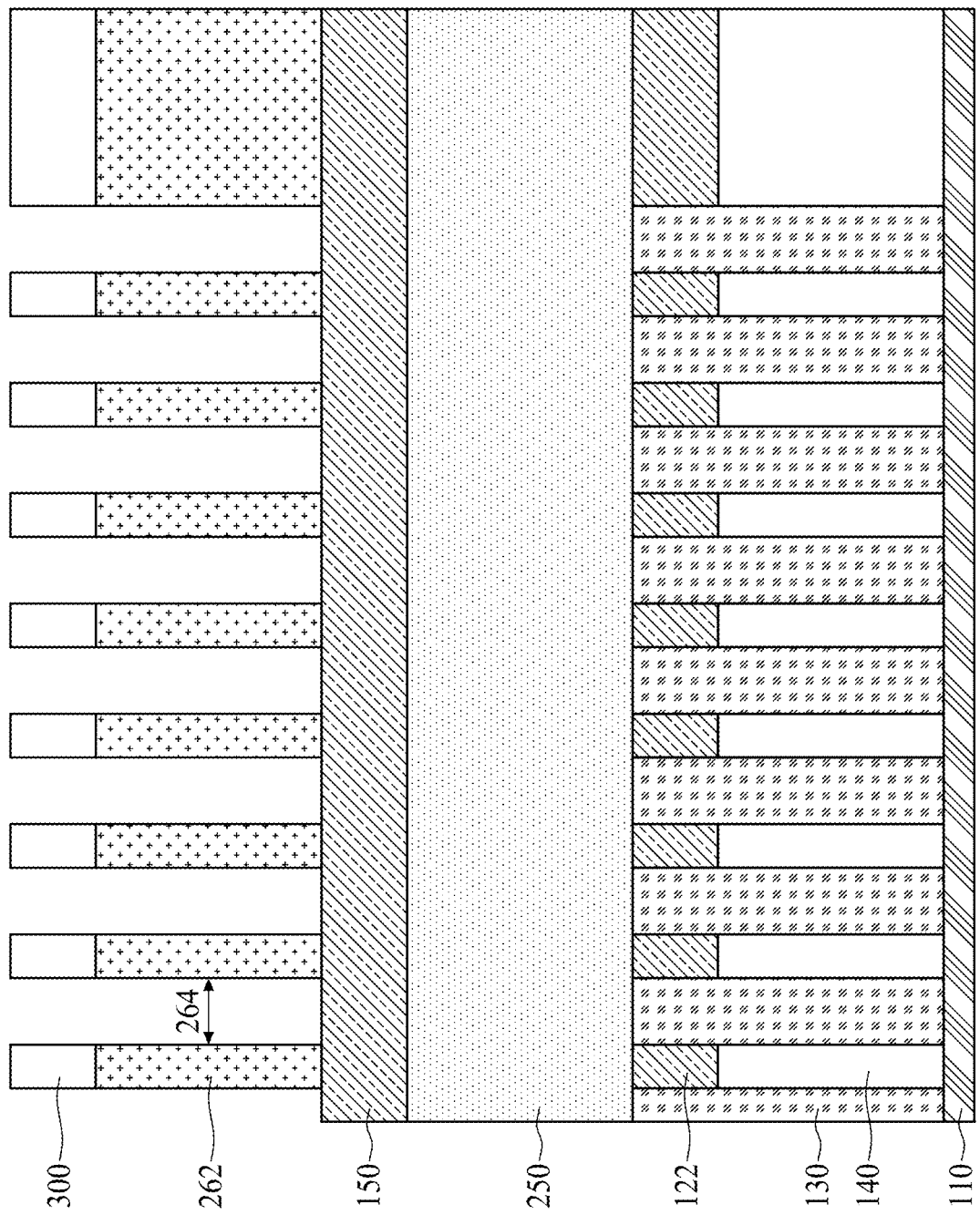

The second polysilicon layer 260 is then patterned using the feature pattern 300 as a mask, and thus multiple second openings 264 are formed. The feature pattern 300 acts as a mask for patterning the second polysilicon layer 260; therefore, a second polysilicon hardmask 262, shown in FIG. 13, is formed. A thickness of the second polysilicon layer 260, the second insulative layer 150 and the second sacrificial layer 250 may be adjusted such that each of the layers has a sufficient thickness during the respective etching process (discussed below) to protect the first conductive features 130.

Figure 14:
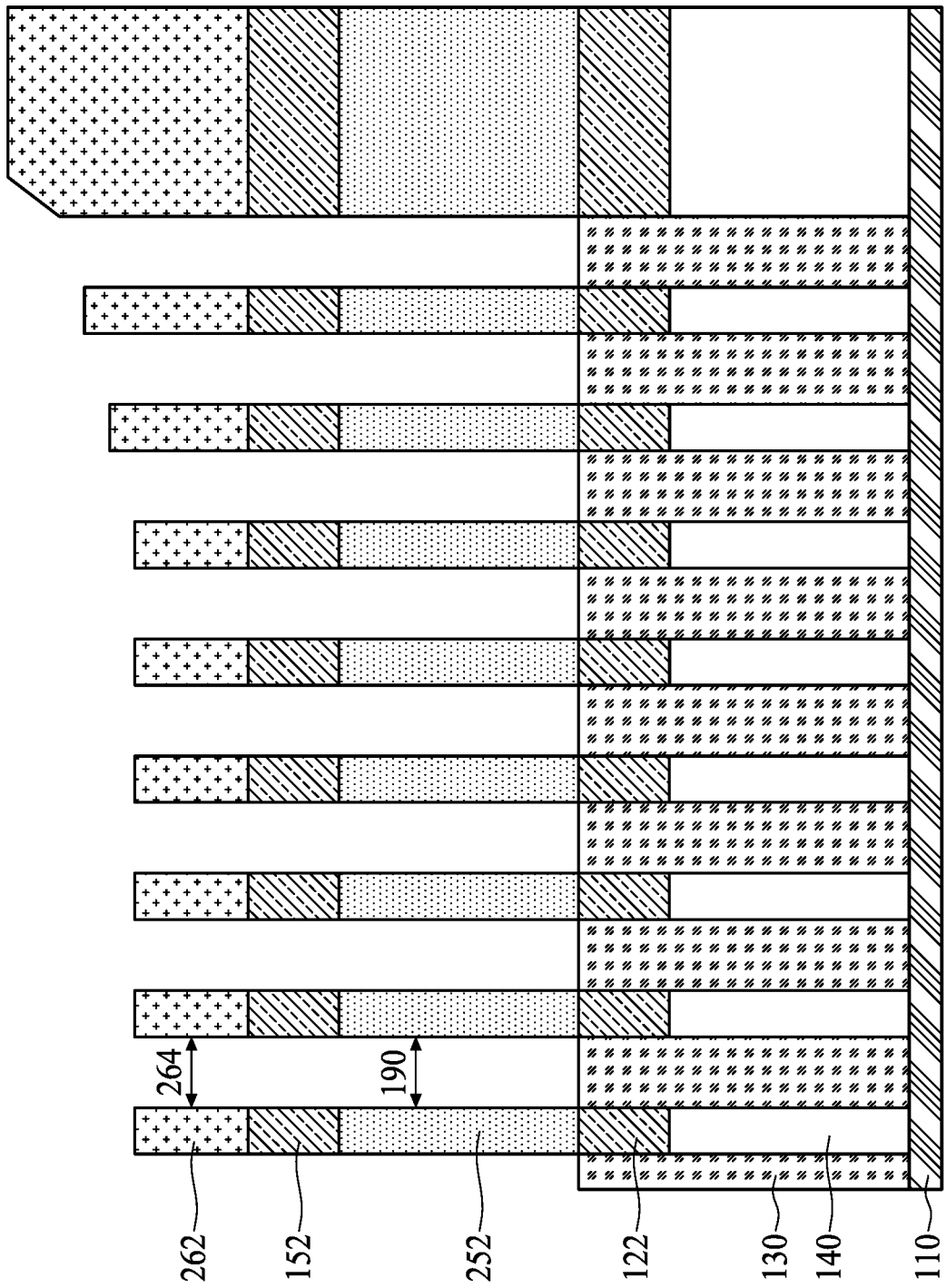

The method then proceeds to a step S426, in which portions of the second insulative layer 150 and the second sacrificial layer 250 exposed by the second polysilicon hardmask 262 are removed; accordingly, multiple second channels 190 to expose portions of the first conductive features 130 are formed, as shown in FIG. 14.

Figure 15:
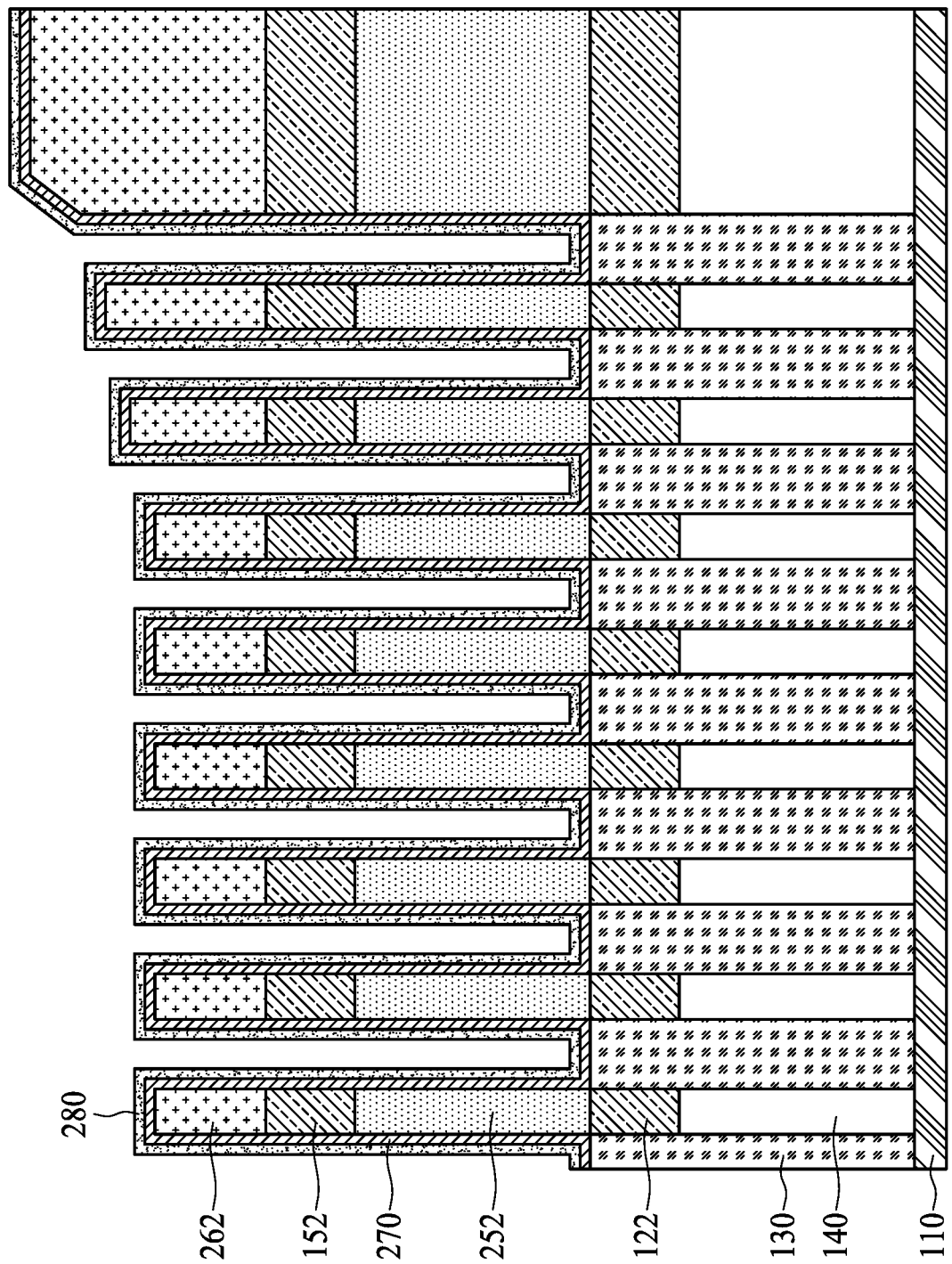

Referring to FIG. 15, a second metal film 270 is formed on the second polysilicon hardmask 262 and the first conductive features 130 and in the second openings 264 and the second channels 190 according to a step S428 in FIG. 1B. A thickness of the second metal film 270 on the second polysilicon hardmask 262 and the first conductive feature 130 is in conformity with that in the second openings 264 and the second channels 190. That is, the second metal layer 269 does not completely fill the second openings 264 and the second channels 190. The second metal film 270 has a topology following a topology of the second polysilicon hardmask 262, the second insulative layer block 152, the second sacrificial block 252 and the first conductive features 130. In some embodiments, the second metal film 270 is a refractory metal nitride film. The second metal film 270 may be formed using a PVD process or an ALD process.

The method then proceeds to a step S430, in which a second passivation film 280 is formed to cover the second metal film 270. The second passivation film 280, having a substantially uniform thickness and including oxide-based material, is formed using an ALD process.

Figure 16:
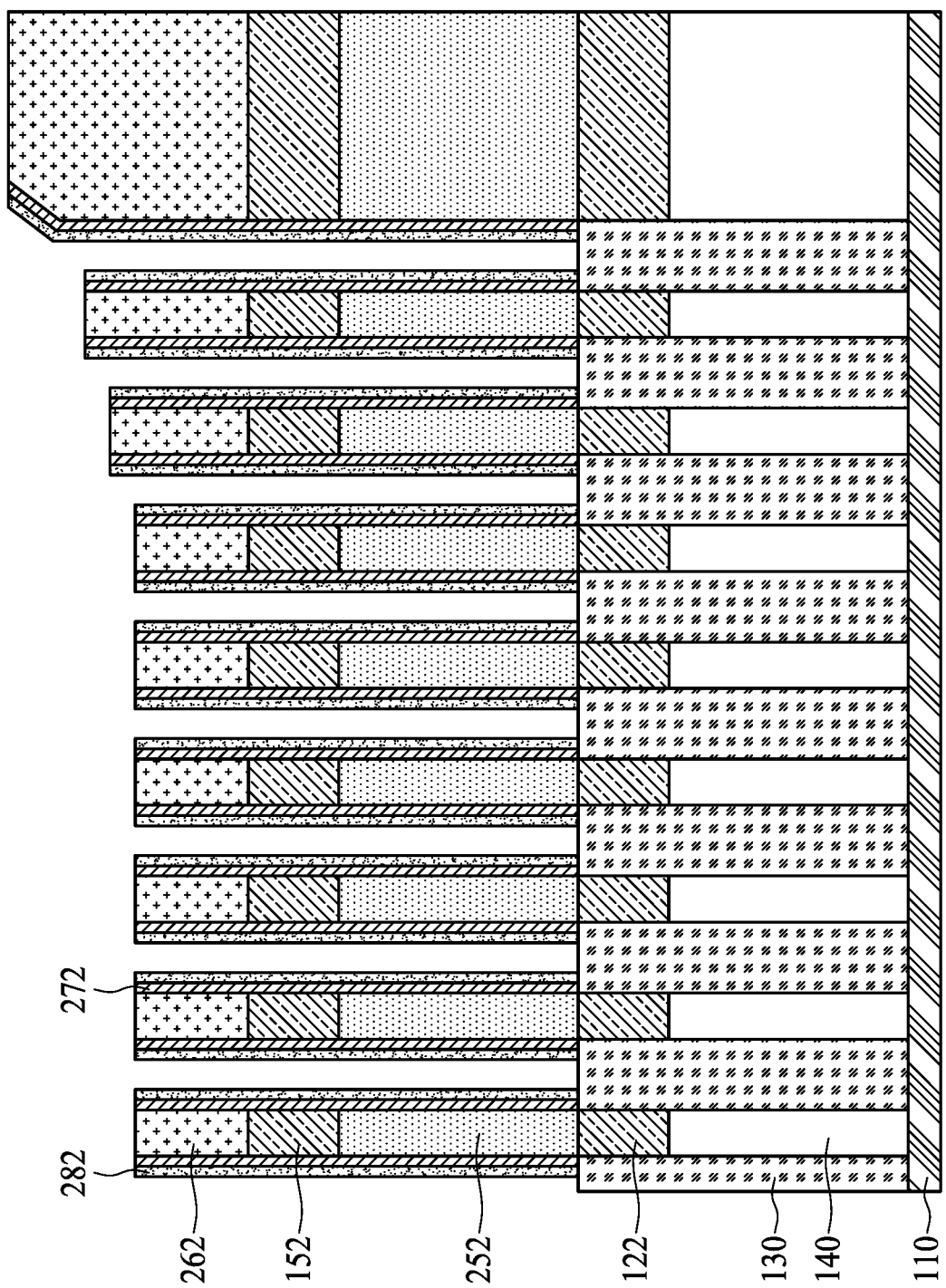

Referring to FIG. 16, the first removal process is performed to remove portions of the second passivation film 280 and the second metal film 270 to thus form multiple second metal liners 272 and multiple second passivation liners 282 according to a step S432 in FIG. 1B. In some embodiments, an anisotropic etching process is utilized to is remove the portions of the second passivation film 280 and the second metal layer 270 over horizontal portions of the first conductive features 130 and the second polysilicon hardmask 262.

Due to the difference in the thicknesses of the second passivation film 280 over horizontal portions of the first conductive features 130 and the second polysilicon hardmask 262, the second passivation liners 282 remain along sidewalls of the second metal layer 270. Similarly, the second metal film 270 is anisotropically etched to remove horizontal portions attached to the first conductive features 130 and the second polysilicon hardmask 262, and the second metal liners 272 remain along sidewalls of the second polysilicon hardmask 262, the second insulative layer 152 and the second sacrificial layer 252. The first removal process uses the reaction gas including boron trichloride, chlorine and carbon tetrafluoride to etch the second passivation film 280 and the second metal film 270 under a pressure of 50 mTorrs.

Figure 17:
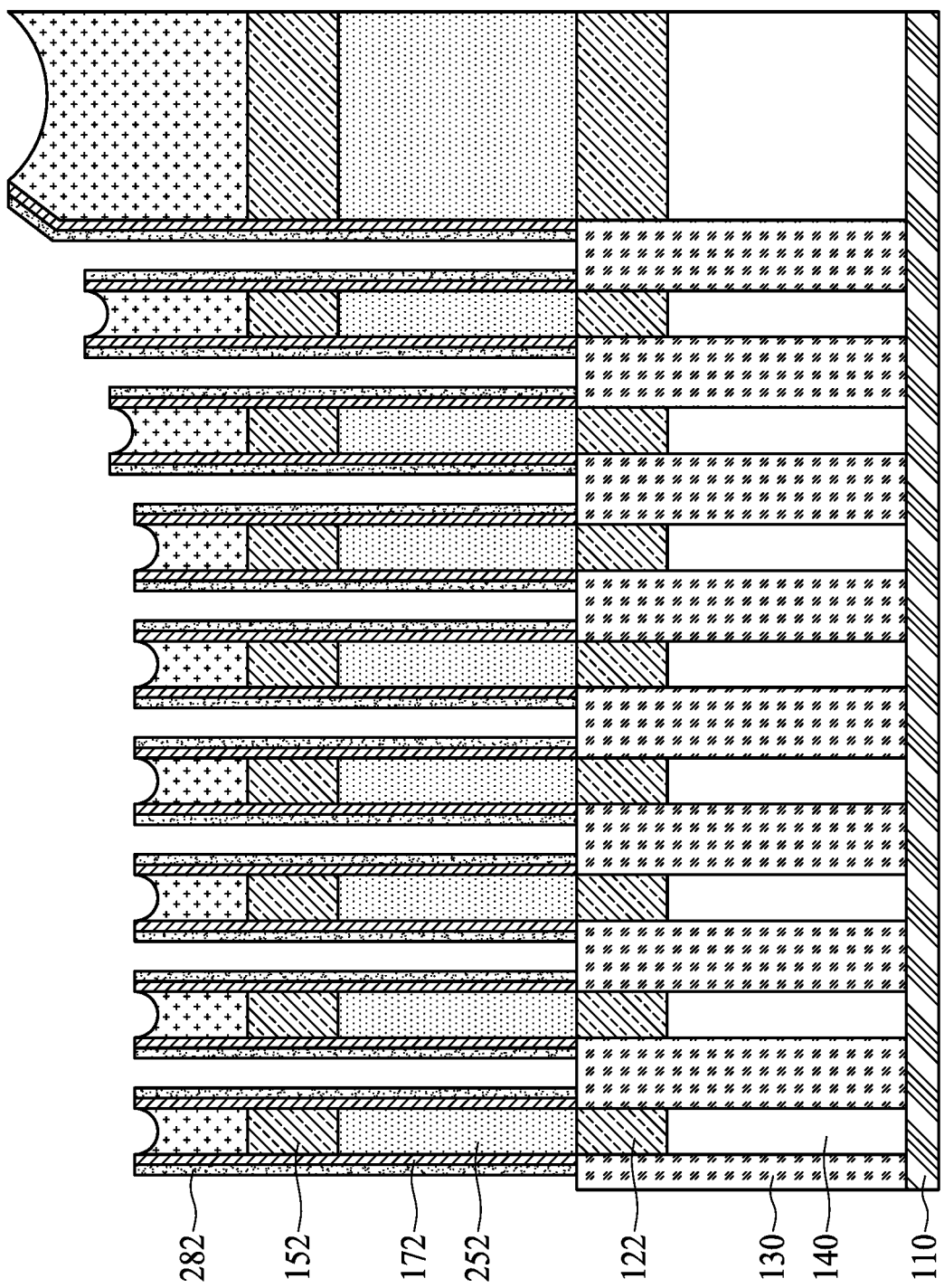

The method then proceeds to a step S434, in which the second removal process is performed to recess the exposed second polysilicon hardmask 262, as shown in FIG. 17, to improve the uniformity in thickness of the second polysilicon hardmask 262 in the array region 102 and the periphery region 104. In some embodiments, the second removal process uses the reaction gases composed of boron trichloride and chlorine to etch the exposed portion of the second polysilicon hardmask 262 under a pressure of 50 mTorrs. Additionally, a ratio of the boron trichloride to the chlorine is, for example, 1:1. In alternative embodiments, the second removal process uses hydrogen bromide as the reaction gas to recess the exposed second polysilicon hardmask 262 is under a pressure of 50 to 80 mTorrs, a power of 1500 watts, a bias voltage of 200 volts, and a duty cycle of 50%.

Figure 18:
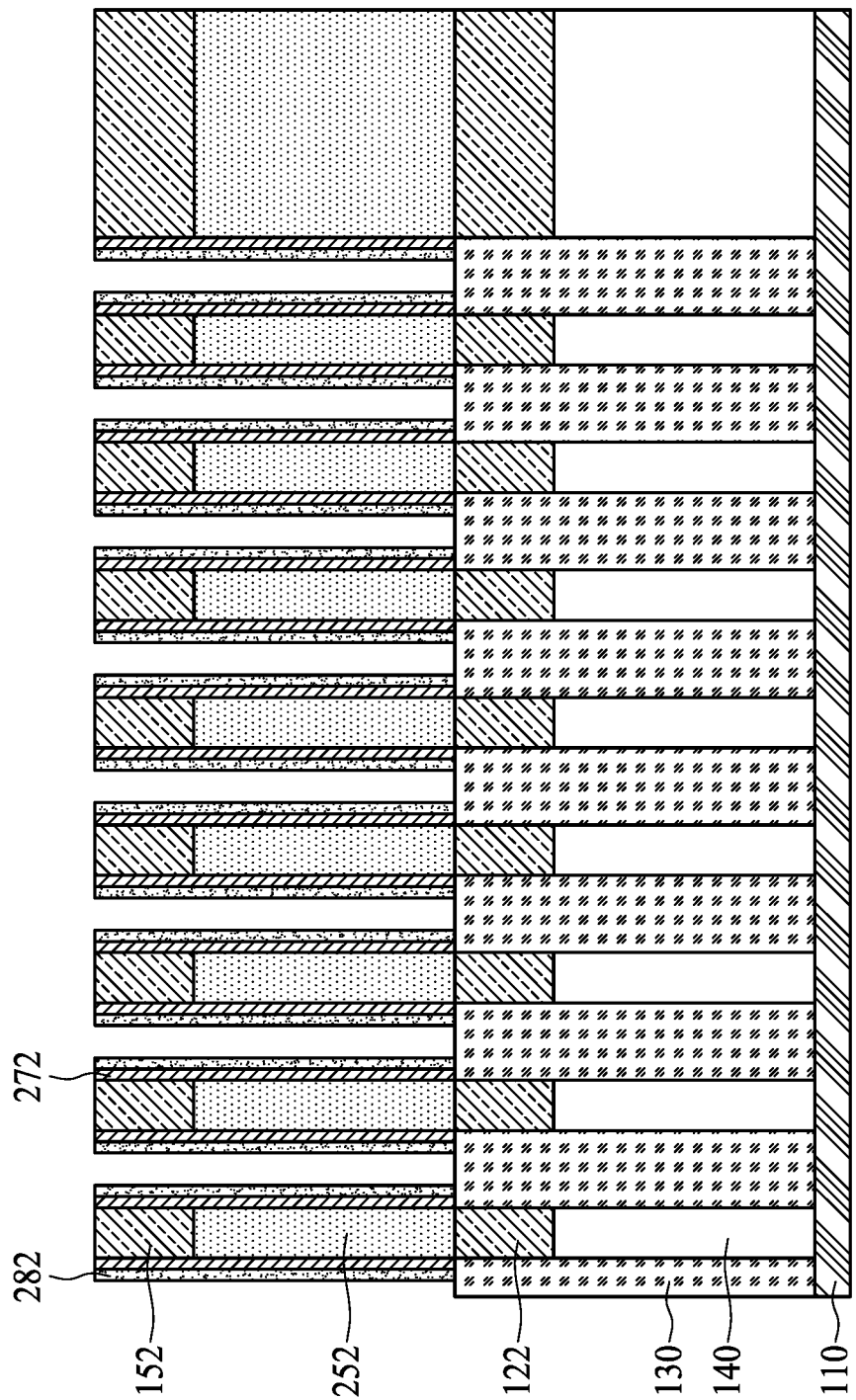

Referring to FIG. 18, the third removal process is performed to remove the second polysilicon hardmask 262 according to a step S436 in FIG. 1C. Portions of the second passivation liners 282 and the second metal liners 272 surrounding the second polysilicon hardmask 262 are simultaneously removed during the removal of the second polysilicon hardmask 262. The third removal process may use a mixture of oxygen, chlorine and carbon tetrafluoride to completely remove the second polysilicon hardmask 262 under a pressure of 10 mTorrs. In some embodiments, a ratio of the oxygen to the chlorine to the carbon tetrafluoride is, for example, 1:20:1.

Figure 19:
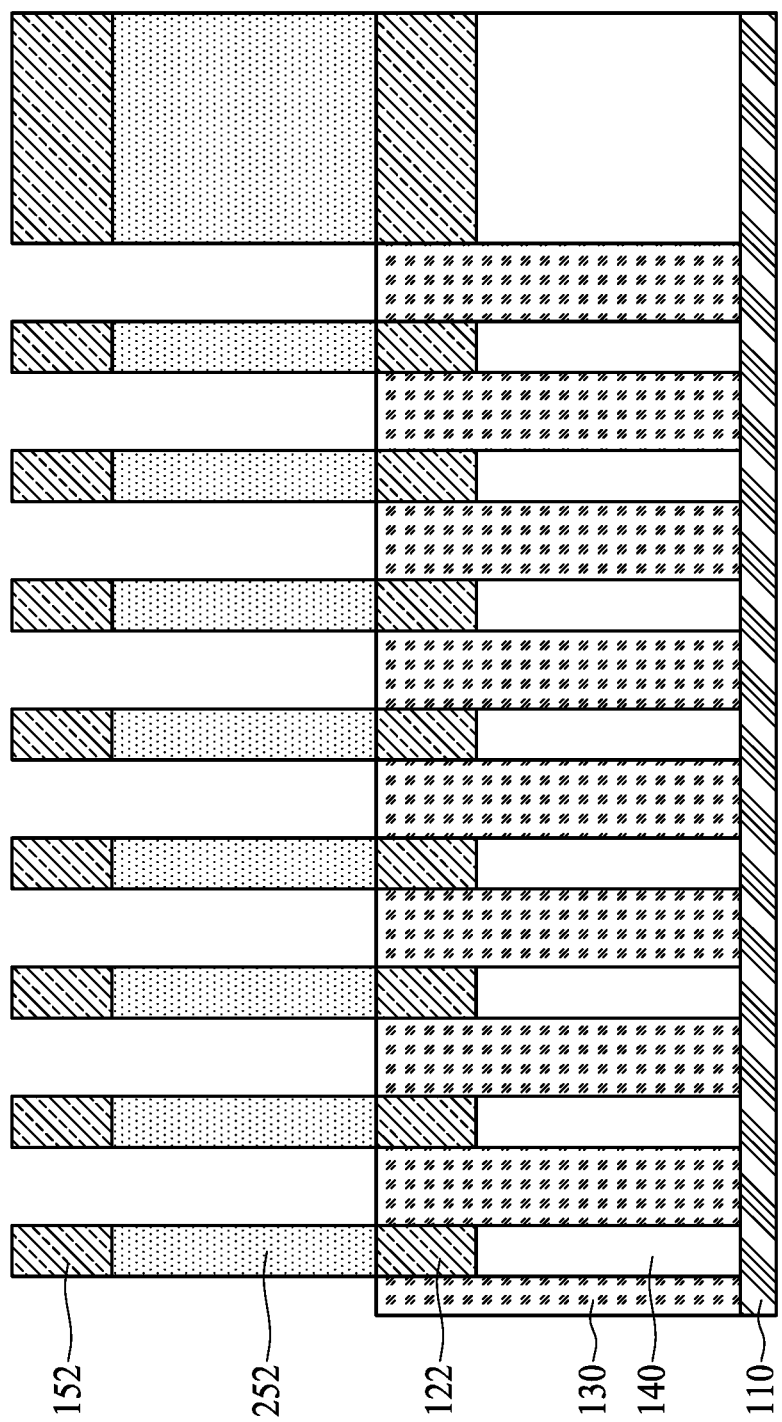

Referring to FIG. 19, after the removal of the second polysilicon hardmask 262, the second passivation liners 282 and the second metal liners 272 are removed from the second insulative layer 152 and the second sacrificial layer 252 in step S438 in FIG. 1C. Therefore, the entire top surfaces of the first conductive features 130 are exposed. The second metal liners 272 and the second passivation liners 282 are removed using wet etching processes. In some embodiments, the second metal liners 282 may be removed after the second passivation liners 282 are completely removed.

Figure 20:
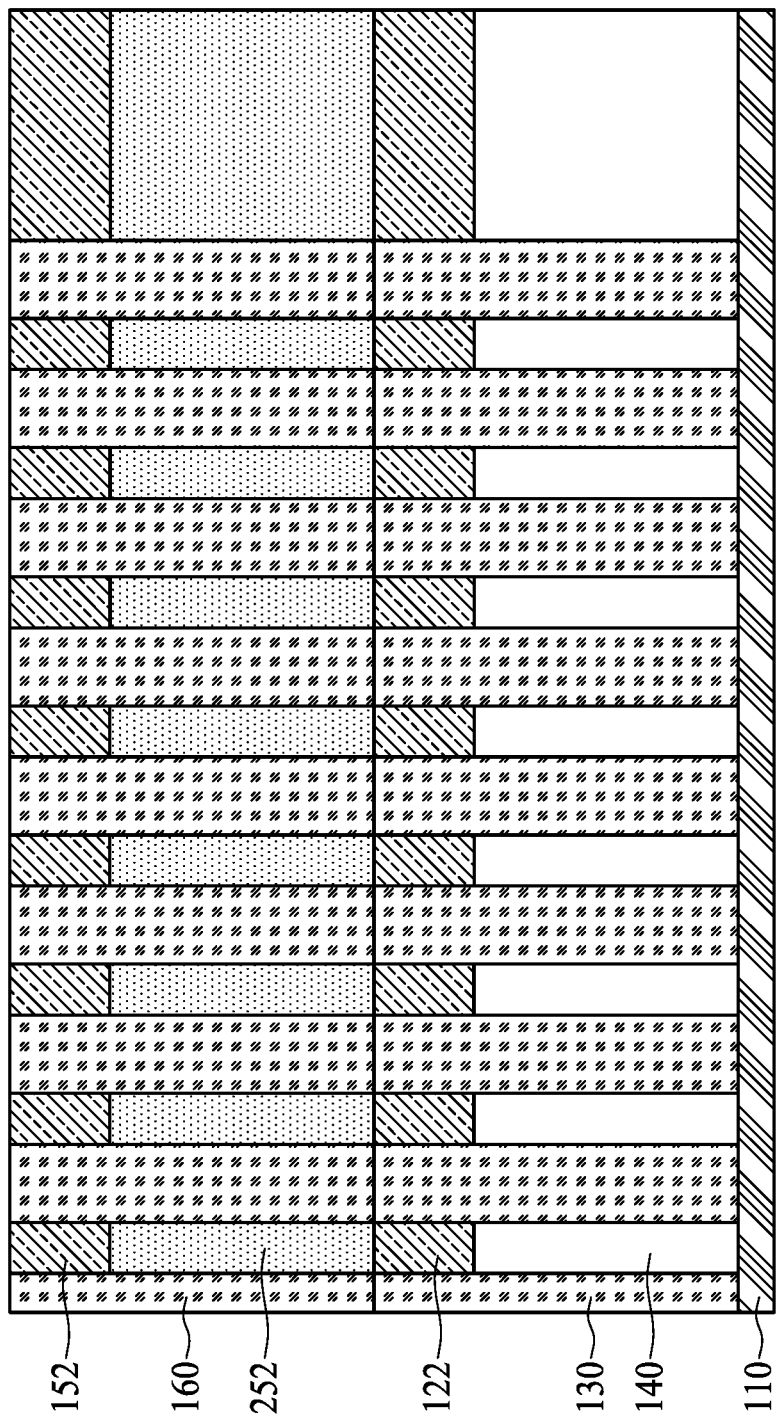

Referring to FIG. 20, a second conductive material is deposited in the second channels 190 according to a step S440 in FIG. 1C. The first and second conductive materials may be metal-containing material, for example, tungsten. The second conductive material may be uniformly deposited to fill the second channels 190 and cover the second insulative layer 152 until the second channels 190 are entirely filled. Next, a planarization process, which may include a CMP process, is performed on the second conductive material until the second insulative layer 152 is exposed. Accordingly, multiple second conductive features 160, parallel to each other, are formed. The second conductive features 160 are respectively connected to the first conductive features 130. After the planarization process, top surfaces of the second conductive features 160 and top surfaces of the second insulative layer 152 are level with each other.

Figure 21:
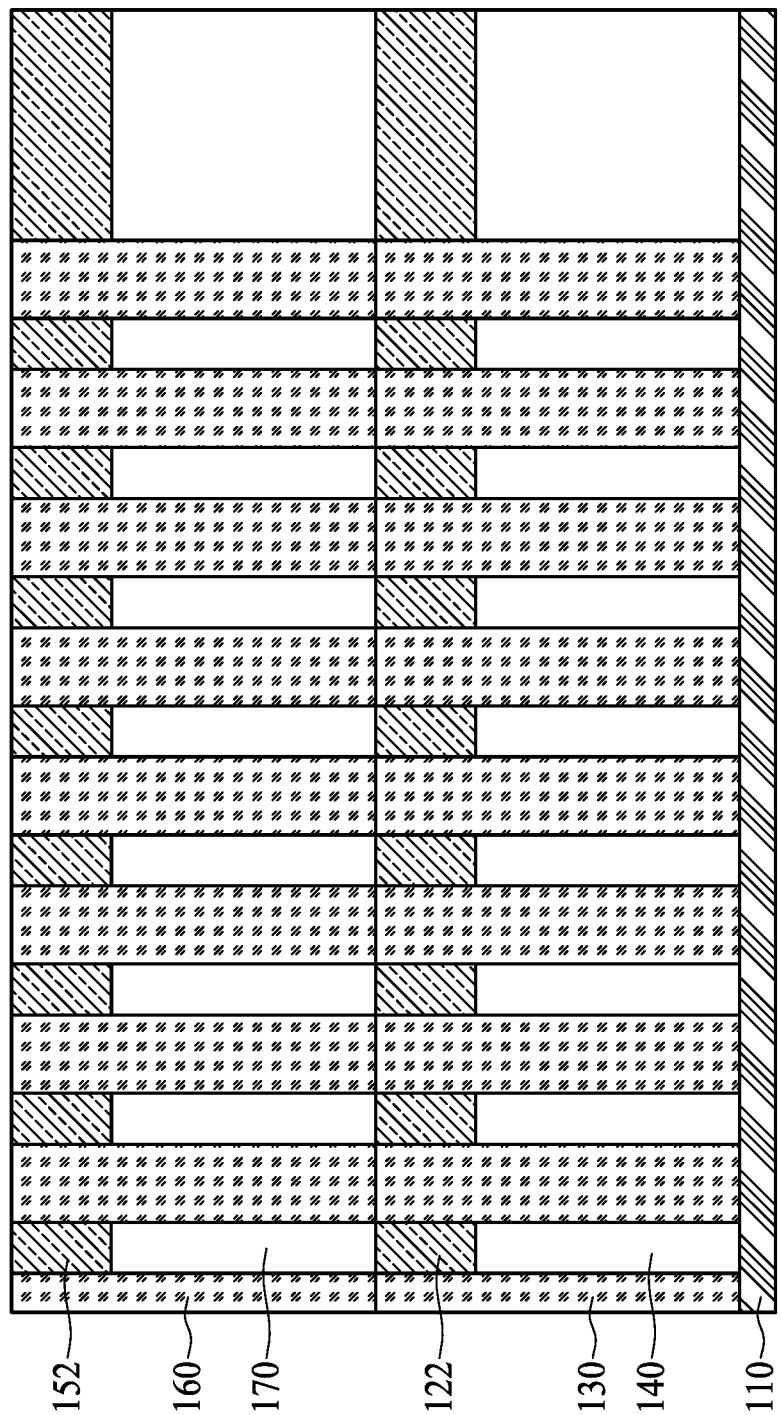

Referring to FIG. 21, the second sacrificial layer 252 is removed according to a step S442 in FIG. 1C. Consequently, spaces previously occupied by the second sacrificial layer 252 remain as air gaps 170. Each of the air gaps 170, holding an ambient gas (such as air), extend between the first insulative layer 122 and the second insulative layer 152 and between the second conductive features 160 spaced apart from each other by a predefined distance. The second sacrificial layer 252 may be removed using a strip process and/or a wet etching process.

Figure 22:
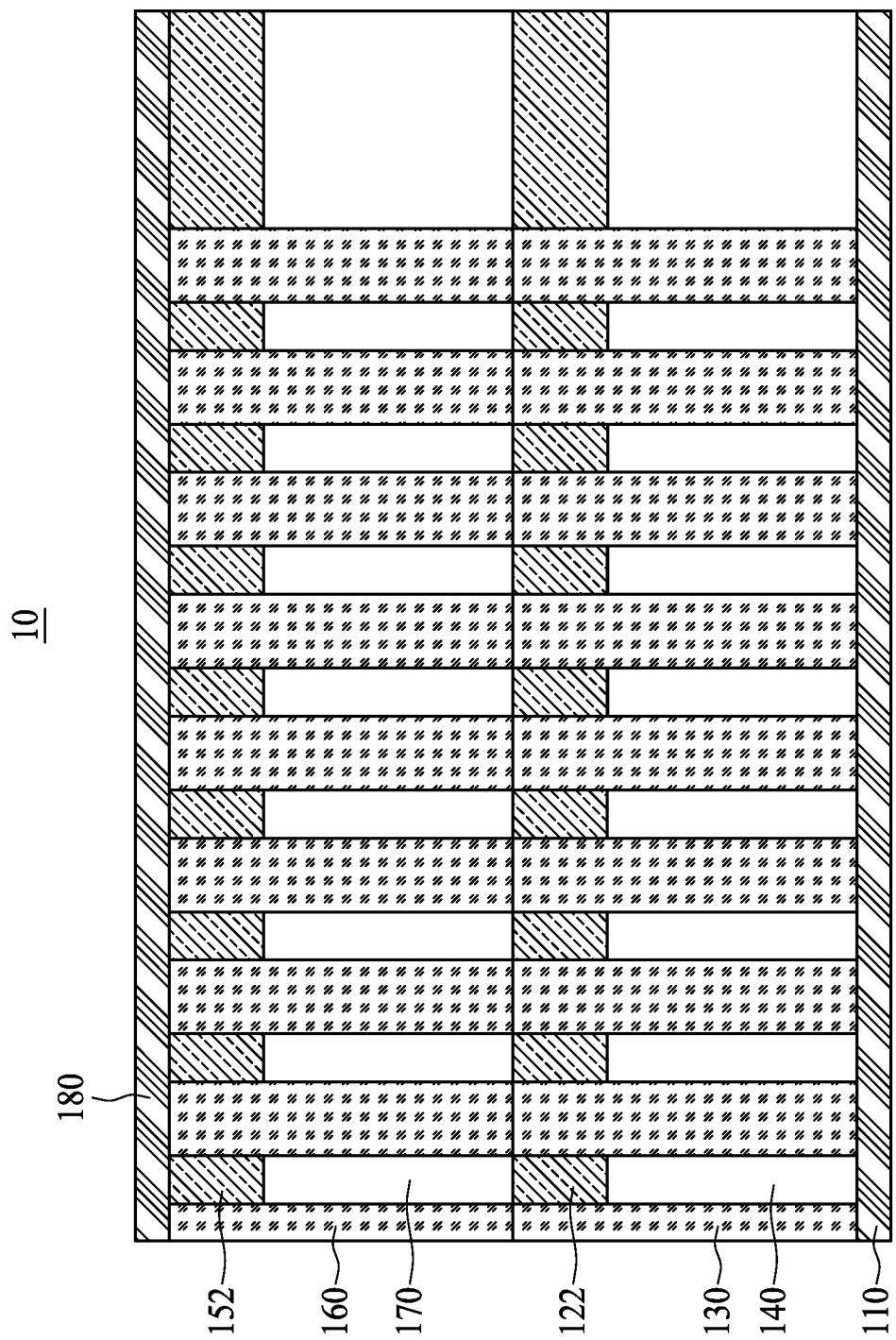

Referring to FIG. 22, a top electrode 180 is formed on the second insulative layer 152 and the second conductive features 160 according to a step S444 in FIG. 1C. Consequently, the capacitor array 10 is completely formed. The top electrode 180 can be formed of low-resistivity metal material.

As shown in FIG. 22, the capacitor array 10 includes a bottom electrode 110, a top electrode 180, a first insulative layer 122, a second insulative layer 152, multiple first conductive features 130, multiple second conductive features 160, and multiple air gaps 140 and 170. The top electrode 180 is spaced apart from the bottom electrode 110, and the first insulative layer 122 is between the bottom electrode 110 and is the top electrode 180. The first conductive features 130 extending from the bottom electrode 110 and into the first insulative layer 122. The second insulative layer 152 is attached to the top electrode 180, and the second conductive features 160 extend from the first conductive features 140 and into the second insulative layer 152.

The air gaps 140 extend between the bottom electrode 110 and the first insulative layer 122 and between the first conductive features 130 spaced apart from each other by a predefined distance. The air gaps 170 extend between the first insulative layer 122 and the second insulative layers 152 and between the second conductive features 160. The air gaps 140 and 170, holding an ambient gas (such as air).

The bottom electrode 110 may include at least one of a doped semiconductor material (e.g., doped silicon), a conductive metal nitride (e.g., titanium nitride, tantalum nitride, and/or tungsten nitride), a metal (e.g., ruthenium, iridium, titanium, and/or tantalum), and a conductive metal oxide (e.g., iridium oxide). The top electrode 180, capping the second insulative layer 152 and the second conductive features 160, may be formed of the same material as the lower electrode 110. Alternatively, the top electrode 180 may include a conductive material different from that of the lower electrode 110. The first insulative layer 122, connecting the first conductive features 130, and the second insulative layer 152, connecting the second conductive features 160, include nitride.

In conclusion, with the method that includes patterning a substrate including the insulative layer 122 and the insulative layer 152 of nitride and the sacrificial blocks 212 and the sacrificial layer 252 of oxide using the polysilicon hardmasks 222/262 on the substrate, the polysilicon hardmasks 222/262 over the insulative layer 122 and the patterned insulative layer 152 can be removed by performing the first to third removal processes in situ, so that possibility of contamination can be reduced and the processing time may be saved.

One aspect of the present disclosure provides a substrate processing method. The substrate processing method comprises steps of providing a substrate comprising a first insulative layer and a second insulative layer stacked on the first insulative layer; forming a polysilicon hardmask on the second insulative layer; etching the first insulative layer and the second insulative layer through at least one opening in the polysilicon hardmask; conformally depositing a metal film and a passivation layer on the second insulative layers and the polysilicon layer and in the opening; performing a removal process to remove horizontal portions of the passivation film and the metal film to expose the polysilicon hardmask; and performing a dry etching process using an etchant comprising boron trichloride and chlorine to remove the polysilicon hardmask.

One aspect of the present disclosure provides a method of manufacturing a capacitor array. The method comprises steps of forming a bottom electrode; depositing a first insulative layer on the bottom electrode; depositing a second insulative layer on the first insulative layer; forming a polysilicon hardmask on the second insulative layer; etching the first insulative layer and the second insulative layer through at least one opening in the polysilicon hardmask; conformally depositing a metal film and a passivation film on the second insulative layers and the polysilicon layer and in the opening; performing a removal process to remove horizontal portions of the passivation film and the metal film to expose the polysilicon is hardmask; and performing a dry etching process using an etchant comprising hydrogen bromide and chlorine to remove the polysilicon hardmask.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method for processing a substrate, comprising:
providing a substrate comprising a sacrificial layer and an insulative layer stacked on the sacrificial layer;
forming a polysilicon hardmask on the insulative layer;
etching the insulative layer and the sacrificial layer exposed through a plurality of openings of the polysilicon hardmask to form a plurality of channels, wherein each of the channels is indented from a top surface of the polysilicon hardmask through the polysilicon hardmask, the insulative layer and the sacrificial layer;
depositing a metal film on the polysilicon hardmask and in the channels, wherein the metal film covers the top surface of the polysilicon hardmask and sidewalls of the channels;
depositing a passivation film on the metal film to cover the top surface of the polysilicon hardmask and sidewalls of the channels;
performing a first removal process to remove portions of the passivation film and the metal film above the polysilicon hardmask, wherein the passivation film and the metal film above the top surface of the polysilicon hardmask are removed after the first removal process to expose the top surface of the polysilicon hardmask;
performing a second removal process to remove portions of the polysilicon hardmask exposed through the passivation film and the metal film, wherein the polysilicon hardmask is recessed from the top surface thereof after the second removal process; and
performing a third removal process to remove the polysilicon hardmask and portions of the passivation film and the metal film surrounding the polysilicon hardmask.

2. The method of claim 1, wherein the passivation film includes oxide and protects the insulative layer and the sacrificial layer from removal during the first, second and third removal processes, wherein each of the channels has a uniform width.

3. The method of claim 1, wherein the first removal process uses a process gas that comprises a mixture of boron trichloride ($BCl_3$), chlorine (Cl) and carbon tetrafluoride ($CF_4$), wherein only the top surface of the polysilicon hardmask is exposed after the first removal process, wherein the top surface of the polysilicon hardmask is a flat top surface.

4. The method of claim 3, wherein a ratio of the boron trichloride ($BCl_3$) to the chlorine (Cl) to the carbon tetrafluoride ($CF_4$) is 2:1:1.

5. The method of claim 4, wherein the first removal process is performed under a pressure of 50 mTorrs.

6. The method of claim 1, wherein the second removal process uses boron trichloride ($BCl_3$) and chlorine (Cl) as reaction gases, wherein the top surface of the polysilicon hardmask is a concave surface after the second removal process.

7. The method of claim 6, wherein a ratio of the boron trichloride ($BCl_3$) to the chlorine (Cl) is 1:1.

8. The method of claim 7, wherein the second removal process is performed under a pressure of 10 mTorrs.

9. The method of claim 1, wherein the second removal process uses hydrogen bromide (HBr) as a reaction gas, wherein the top surface of the polysilicon hardmask is a concave surface after the second removal process.

10. The method of claim 9, wherein the second removal process is performed under a pressure of 50 to 80 mTorrs.

11. The method of claim 9, wherein the second removal process is preformed under a power of 1500 watts, a bias voltage of 200 volts, and a duty cycle of 50%.

12. The method of claim 1, wherein the third removal process uses chlorine (Cl), oxygen ($O_2$) and carbon tetrafluoride ($CF_4$) as reaction gases, wherein the polysilicon hardmask is completely removed from the insulating layer during the third removal process to expose a top surface of the insulative layer.

13. The method of claim 12, wherein a ratio of the chlorine (Cl) to the oxygen ($O_2$) to the carbon tetrafluoride ($CF_4$) is 20:1:1.

14. The method of claim 12, wherein the third removal process is performed under a pressure of less than 20 mTorrs.

15. The method of claim 1, wherein the passivation film, comprising oxide, is formed using an atomic layer deposition process, wherein the passivation film has a uniform thickness covering the top surface of the polysilicon hardmask and sidewalls of the channels.

16. The method of claim 1, wherein the metal film comprises refractory metal and nitride, wherein the metal film has a uniform thickness covering the top surface of the polysilicon hardmask and sidewalls of the channels.

17. The method of claim 1, wherein a thickness of insulative layer is less than a thickness of the sacrificial layer.

* * * * *